United States Patent
Kadija

(10) Patent No.: US 10,480,092 B2
(45) Date of Patent: Nov. 19, 2019

(54) APPARATUS AND METHOD OF CONTACT ELECTROPLATING OF ISOLATED STRUCTURES

(71) Applicant: ECSI Fibrotools, Inc., Raleigh, NC (US)

(72) Inventor: Igor V. Kadija, Raleigh, NC (US)

(73) Assignee: ECSI Fibrotools Inc., Raleigh, NC (US)

( * ) Notice: Subject to any disclaimer, the term of this patent is extended or adjusted under 35 U.S.C. 154(b) by 0 days.

(21) Appl. No.: 16/190,314

(22) Filed: Nov. 14, 2018

(65) Prior Publication Data

US 2019/0112723 A1  Apr. 18, 2019

Related U.S. Application Data

(63) Continuation of application No. 15/368,096, filed on Dec. 2, 2016, now Pat. No. 10,184,189.

(60) Provisional application No. 62/493,827, filed on Jul. 18, 2016.

(51) Int. Cl.
| | |
|---|---|
| C25D 5/02 | (2006.01) |
| C25D 7/12 | (2006.01) |
| C25D 5/20 | (2006.01) |
| C25D 5/18 | (2006.01) |
| C25D 5/06 | (2006.01) |
| C25D 17/14 | (2006.01) |
| C25D 17/00 | (2006.01) |
| H01L 21/48 | (2006.01) |
| H01L 21/288 | (2006.01) |
| H01L 21/768 | (2006.01) |
| H05K 3/18 | (2006.01) |

(52) U.S. Cl.
CPC ............ *C25D 7/123* (2013.01); *C25D 5/02* (2013.01); *C25D 5/06* (2013.01); *C25D 5/18* (2013.01); *C25D 5/20* (2013.01); *C25D 17/005* (2013.01); *C25D 17/14* (2013.01); *H01L 21/2885* (2013.01); *H01L 21/76873* (2013.01); *H01L 21/76877* (2013.01); *C25D 17/001* (2013.01); *H05K 3/188* (2013.01)

(58) Field of Classification Search
None
See application file for complete search history.

(56) References Cited

U.S. PATENT DOCUMENTS

| | | |
|---|---|---|
| 4,159,934 A | 7/1979 | Kadija |
| 5,024,735 A | 6/1991 | Kadija |
| 5,114,558 A | 5/1992 | Kadija |

(Continued)

FOREIGN PATENT DOCUMENTS

JP  53297588 A  12/1988

OTHER PUBLICATIONS

WIPO, International Preliminary Report on Patentability for PCT/US2017/041817, dated Jan. 22, 2019.

(Continued)

*Primary Examiner* — Stefanie S Wittenberg
(74) *Attorney, Agent, or Firm* — NK Patent Law

(57) ABSTRACT

The presently disclosed apparatus and method offer the capability to electroplate pure metals or alloys onto substrates, having no current collectors or being connected to the power supply by a low conductivity seed layer. Thus, the disclosed system enables pure metal or alloy deposition on various substrates, including flexible electronic circuits, wafers for IC processing, and discrete electronic devices in surface finishing applications.

20 Claims, 25 Drawing Sheets

(56) References Cited

U.S. PATENT DOCUMENTS

| | | |
|---|---|---|
| 6,071,400 A | 6/2000 | Schroder et al. |
| 6,764,586 B1 | 7/2004 | Fleury |
| 6,796,027 B2 | 9/2004 | Suzuki et al. |
| 6,802,955 B2 | 10/2004 | Emesh et al. |
| 6,916,685 B2 | 7/2005 | Yang et al. |
| 7,025,860 B2 | 4/2006 | Chadda |
| 7,147,767 B2 | 12/2006 | Boyd et al. |
| 7,189,647 B2 | 3/2007 | Patton et al. |
| 7,201,828 B2 | 4/2007 | Emesh |
| 7,297,239 B2 | 11/2007 | Emesh et al. |
| 7,449,098 B1 | 11/2008 | Mayer et al. |
| 7,566,653 B2 | 7/2009 | Yang et al. |
| 7,700,975 B2 | 4/2010 | Rakshit et al. |
| 7,947,157 B2 | 5/2011 | Ravkin et al. |
| 8,071,468 B2 | 12/2011 | Sameshima et al. |
| 8,232,195 B2 | 7/2012 | Yang et al. |
| 8,405,953 B2 | 3/2013 | Fujii et al. |
| 8,671,563 B2 | 3/2014 | Maijala et al. |
| 8,786,062 B2 | 7/2014 | Su et al. |
| 8,828,482 B1 | 9/2014 | Ruffini et al. |
| RE45,297 E | 12/2014 | Redline et al. |
| 8,987,910 B2 | 3/2015 | Ozkok et al. |
| 9,064,985 B2 | 6/2015 | Zaban et al. |
| 9,165,900 B2 | 10/2015 | Su et al. |
| RE45,842 E | 1/2016 | Redline et al. |
| RE45,881 E | 2/2016 | Redline et al. |
| 9,255,208 B2 | 2/2016 | Dorfman et al. |
| 9,301,391 B2 | 3/2016 | Chew et al. |
| 9,309,550 B2 | 4/2016 | Cooper et al. |
| 9,338,894 B2 | 5/2016 | Van Den Brand et al. |
| 9,343,233 B2 | 5/2016 | Tentzeris et al. |
| 9,451,706 B1 | 9/2016 | Ng et al. |
| 9,478,741 B2 | 10/2016 | Hsu |
| 9,478,939 B2 | 10/2016 | Lai et al. |
| 9,484,211 B2 | 11/2016 | Lee et al. |
| 9,484,223 B2 | 11/2016 | Tseng et al. |
| 9,484,292 B2 | 11/2016 | Hwang et al. |
| 9,484,293 B2 | 11/2016 | Ebefors et al. |
| 9,484,316 B2 | 11/2016 | Napetschnig et al. |
| 9,484,325 B2 | 11/2016 | Uzoh |
| 9,484,385 B2 | 11/2016 | Weng et al. |
| 9,484,498 B2 | 11/2016 | Hsu |
| 9,484,512 B2 | 11/2016 | Kawano |
| 9,485,864 B2 | 11/2016 | Imafuji et al. |
| 2007/0215461 A1 | 9/2007 | Zuber et al. |
| 2016/0108534 A1 | 4/2016 | Dai et al. |

OTHER PUBLICATIONS

Zhang, T., et al., A laser printing based approach for printed electronic, Applied Physics Letters, 2016, p. 1, 108, 103501.

PCT, International Search Report in International Application No. PCT/US2017/041817 dated Oct. 20, 2017.

PCT, Written Opinion in International Application No. PCT/US2017/041817 dated Oct. 20, 2017.

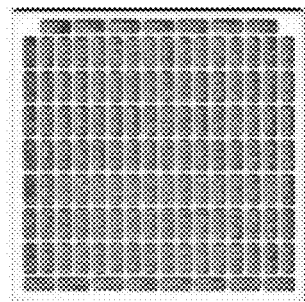
Fig. 16a
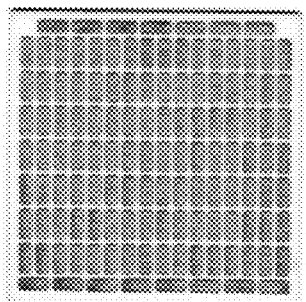
Fig. 16b
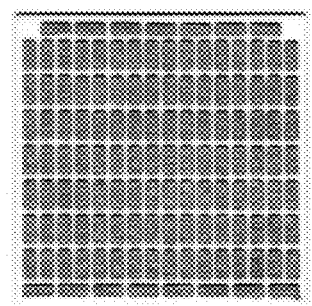
Fig. 16c
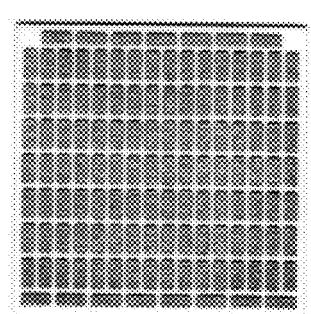
Fig. 16d
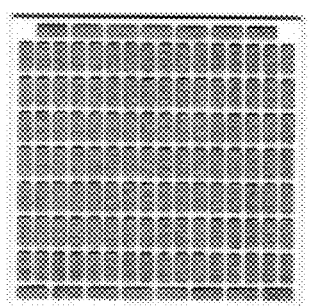
Fig. 16e
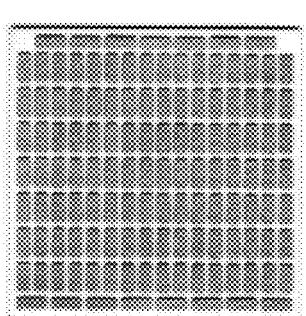
Fig. 16f
Figure 16a - 16f

APPARATUS AND METHOD OF CONTACT ELECTROPLATING OF ISOLATED STRUCTURES

CROSS REFERENCE TO RELATED APPLICATION

This application is a continuation application of U.S. patent application Ser. No. 15/368,096 filed Dec. 2, 2016, which claims priority to U.S. Provisional Patent Application No. 62/493,827 filed Jul. 18, 2016, the content of which is hereby incorporated by reference in its entirety.

TECHNICAL FIELD

The presently disclosed subject matter relates to an apparatus and method of electroplating metals by direct contact onto isolated or weekly connected structures, greater than 1e-5S.

BACKGROUND

Flexible Electronics

Flexible electronics, having no common current collector, are predominantly produced by ink-jet or screen printing of metal and carbon pastes over a flexible substrate. Having inferior conductivity compared to pure metals, metal pastes are usually significantly thicker than the pure metal. The process is complex, including solvents and high temperature treatments of pastes and polymer structures to achieve functional products. Typically, inferior property of the metal pastes (such as low conductivity and excessive thickness) limit the progress of the industry, particularly in the field of high density flexible electronics.

To optimize the process, another approach to flexible electronics involves sintering of metal nanoparticles, such as silver. For example, U.S. Pat. No. 9,343,233 describes a method of depositing suspension of silver nanoparticles followed by sintering at 170-180° C. for 30 to 40 minutes. Again, the process remains complex and time-consuming and includes pushing the substrate performance to the limits.

More recently, efforts have been made to eliminate chemical and thermal processing of the pastes. For example, T. Zhang et al. ("A Laser Printing Based Approach for Printed Electronic", Applied Physics Letters 108, 103501 (2016)) introduce the technique of electroless plating of substrate layers coated with electroless process catalysts, such as palladium. The technique involves patterning the substrate using laser selected deposition of palladium catalyst-modified toner, melting and fusing it onto the substrate, and then completing the process by electroless deposition of desired metal (e.g., copper). While much progress has been made in the fields of electroless and immersion plating, both processes are extremely slow and prone to failure due to the lack of direct control by the operator. That is, both processes are spontaneous and hard to control and maintain, thereby delivering metals of inferior properties (i.e., metals with porosity and occlusion issues). Moreover, while removing undesirable steps from prior art processing, the T. Zhang et. al. approach introduces new steps that appear to make the process more complex and potentially slowing it down significantly, with electroless deposition rate in the range of just few nanometers per second.

Surface Finishing

Similarly, surface finishing (such as electroless and/or immersion finishing of PWB and discrete electronic devices) is typically applied on electronic circuitry or devices that have nearly been completed. In the prior art, surface finishing is applied after the common current collector has been removed and the circuitry or devices become electrically isolated. Thus, the prior art technology/method of providing electroplating current to the points of surface finishing is not applicable.

Hence, it would be useful to provide an electroplating apparatus and method capable of replacing application of metal pastes and standard electroless and immersion technology with pure metals on PWBs, flexible electronics, and discrete electronic devices.

IC Processing

In many electroplating processes, there is a need to electroplate a multitude of micro and nano isolated structures simultaneously across the large patterned area. In order to overcome the problem of establishing electrical contacts to all structures on the substrate, the prior art utilizes the so called "seed layer" (SL). Typically, the SL is made of a thin coating (one micron or less) of gold, silver, or copper deposited by CV or plasma deposition—or by similar techniques providing conductive but lower grade metal. Having a SL of minimal resistance itself and all structures patterned and defined on top of the SL or carved as trenches in the substrate and thus electrically interconnected, they can now be electroplated simultaneously. The problem arises from the need to provide uniform electrical current to features that are several centimeters to several decimeters away from the closest peripheral heavy gauge contact with the power supply. In particular, that becomes evident in IC fabrication. Damascene and dual damascene nano-size structures, calling for only 10 plus nano-meters wide and high features carved/etched in the substrate, can preferably utilize an SL of less than several nanometer thicknesses. Otherwise, a 10 plus nano meter or 1000 nm thick low grade SL would defeat the design specs for the IC structure of high grade metal 10 plus nanometers total. Thus, it becomes impractical to deposit thicker SL, needed for sufficient current carrying capability, with the goal of 10 plus nanometer size electroplated IC device. Consequently, due to a limited current carrying capability of such thin SL, a significant problem arises of simultaneously growing a multitude of micro and nano structures over large surface areas of substrate. To overcome this problem, several examples are described in U.S. Pat. Nos. 7,449,098; 7,947,157; and 8,071,468, which show the trenches, defined by the design of the ICs, that are produced by multiple interchangeable iterations of electroplating and polishing (chemical-mechanical planarization, CMP) due to uneven growth of deposit across the substrate. Hence, a method capable of bypassing peripheral contact and delivering simultaneous electrical contact to each section of the substrate regardless of the SL resistivity and enabling uniform growth of deposits across the substrate would be desirable. In addition, the method offers the capability to eliminate peripheral electrical contact, a complex structural section of each IC electroplating device utilized in the state-of-the-art technology. Furthermore, current trends to three dimensional structures including multi-layered devices involve complex design and fabrication steps to enable electroplating for each layer of the stack. Direct access to each seed layer or patterns of the stack by the disclosed device can simplify the process and enable significantly more practical solutions.

SUMMARY

In some embodiments, the presently disclosed subject matter is directed to an apparatus for electroplating a metal onto an isolated substrate or a substrate connected to an inferior resistance current collector, less 1e+5 ohm-cm. The apparatus comprises: (a) a working electrode comprising fine metal mesh, metal fiber cloth, or metal web; (b) a counter electrode; and (c) a chemically inert porous material. In some embodiments, the counter electrode comprises either: (a) fine metal mesh, metal fiber cloth, or metal web; or (b) metal mesh. In some embodiments, current collectors link both electrodes to the respective polarity of a power supply.

In some embodiments, the working electrode and counter electrode are constructed from gold, silver, platinized or Au plated copper or nickel, palladium, platinum, platinized or Au plated titanium or stainless steel, cobalt, thallium, tantalum, rhodium, iridium, ruthenium, osmium or alloys of gold, alloys of silver, tungsten, vanadium, alloys of copper, alloys of nickel, alloys of palladium, alloys of platinum, platinized titanium, or combinations thereof.

In some embodiments, the flexible material is selected from the group comprising porous polymer sponge, pile cloth material, or combinations thereof. In some embodiments, the flexible material has a porosity of at least 40%.

In some embodiments, the apparatus is formed in a pad configuration or a roller configuration.

In some embodiments, the apparatus comprises a detachable perforated compressing pad constructed from a chemically stable rigid polymer material to exert uniform compression.

In some embodiments, the mesh material is platinized or gold-plated copper or stainless steel.

In some embodiments, the apparatus comprises a recirculation element to provide and recirculate electrolyte through the apparatus.

In some embodiments, the apparatus comprises an internal element to provide electrolyte or metal ions to a dry or nearly dry substrate upon contact.

In some embodiments, the apparatus is arranged vertically or horizontally.

In some embodiments, the apparatus comprises a power supply connected to the respective polarity of each electrode, wherein the power supply has a forward and reverse pulse capability of about 0.01 to 10,000 Hertz.

In some embodiments, the apparatus comprises a compression element to enable uniform compression and vibratory motion of the apparatus in the frequency range of 1-100 Hertz and amplitude in the range of 0.64-6.4 mm.

In some embodiments, the apparatus comprises a timed flip-over device synchronized with a power supply.

In some embodiments, the presently disclosed subject matter is directed to a method of electroplating metal onto a substrate. The method comprises obtaining the disclosed apparatus and a substrate to be electroplated, wherein the substrate comprises a patterned seed layer. The method comprises immersing the apparatus in electroplating solution containing the desired metal to be deposited, turning on the power supply, and configuring the apparatus such that the fine metal mesh, fiber cloth, or web of the working electrode is electroplated with 1-2 microns of desired metal prior to pressing the apparatus against the substrate. The method further comprises pressing the apparatus against the substrate to establish intimate contact with the seed layer, simultaneously starting the electroplating process and initiating a vibratory motion to enable exchange of matter at the apparatus/substrate interface, proceeding with DC or reverse pulse electroplating for about 2 to 15 seconds to achieve necessary metal deposition in sequential processing conductivity of the patterns, and releasing the apparatus after deposition. In some embodiments, the method optionally comprises introducing a new substrate. In some embodiments, the vibratory motion is optional.

BRIEF DESCRIPTION OF THE DRAWINGS

The previous summary and the following detailed descriptions are to be read in view of the drawings, which illustrate some (but not all) embodiments of the presently disclosed subject matter.

FIG. 1b is a front sectional view of the apparatus of FIG. 1a.

FIGS. 16a, 16b, 16c, 16d, 16e and 16f illustrate photographs of both nickel and gold electroplated substrates in accordance with some embodiments of the presently disclosed subject matter.

DETAILED DESCRIPTION

I. General Considerations

Figure 1A:
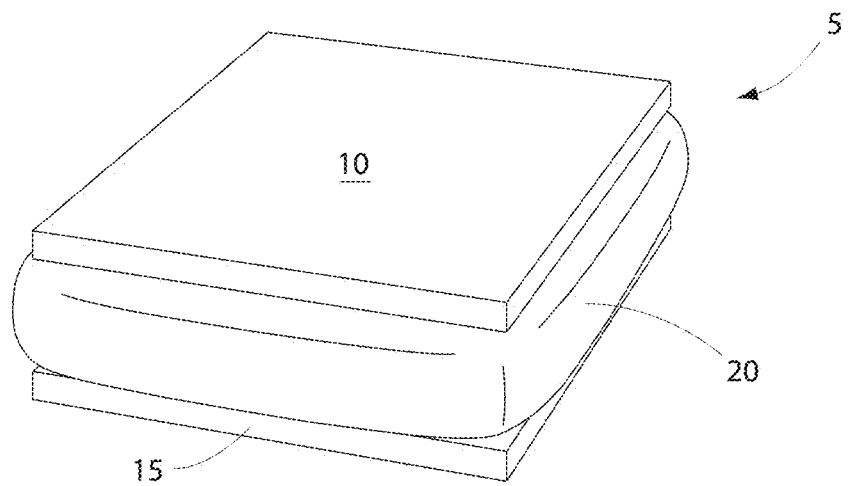
FIG. 1a is a perspective view of one embodiment of the presently disclosed electroplating apparatus.

The presently disclosed subject matter is introduced with sufficient details to provide an understanding of one or more particular embodiments of broader inventive subject matters. The descriptions expound upon and exemplify features of those embodiments without limiting the inventive subject matters to the explicitly described embodiments and features. Considerations in view of these descriptions will likely give rise to additional and similar embodiments and features without departing from the scope of the presently disclosed subject matter.

Unless defined otherwise, all technical and scientific terms used herein have the same meaning as commonly understood to one of ordinary skill in the art to which the presently disclosed subject matter pertains. Although any methods, devices, and materials similar or equivalent to those described herein can be used in the practice or testing of the presently disclosed subject matter, representative methods, devices, and materials are now described.

Following long-standing patent law convention, the terms "a", "an", and "the" refer to "one or more" when used in the subject specification, including the claims. Thus, for example, reference to "an electrode" can include a plurality of such electrodes, and so forth.

Unless otherwise indicated, all numbers expressing quantities of components, conditions, and so forth used in the specification and claims are to be understood as being modified in all instances by the term "about". Accordingly, unless indicated to the contrary, the numerical parameters set forth in the instant specification and attached claims are approximations that can vary depending upon the desired properties sought to be obtained by the presently disclosed subject matter.

As used herein, the term "about", when referring to a value or to an amount of mass, weight, time, volume, concentration, and/or percentage can encompass variations of, in some embodiments +/−20%, in some embodiments +/−10%, in some embodiments +/−5%, in some embodiments +/−1%, in some embodiments +/−0.5%, and in some embodiments +/−0.1%, from the specified amount, as such variations are appropriate in the disclosed packages and methods.

The term "anode" refers to the positive electrode of the disclosed assembly (i.e., the electrode where oxidation or dissolution of metal occurs).

The term "cathode" as used herein refers to the negative electrode of the disclosed assembly (i.e., the electrode where reduction or deposition of metal occurs). In some embodiments, the cathode refers to the workpiece (working electrode) and the anode refers to the counter-electrode.

As used herein, the term "counter electrode" refers to an electrode in an electrochemical circuit that acts as a current source or sink to complete the circuit.

The term "current collector" refers to any of a wide variety of metallic substrates that can be attached to the working or counter electrode to enable current feed to the electrodes from the power supply with minimal resistance. The section of current collector may or may not be submerged in electroplating solution. In some embodiments, the section exposed to electroplating solution may be coated with an inert non-conductive material.

Term "deposition" as used herein refers to any process that grows, coats, or otherwise transfers a material onto a substrate. One non-limiting example of a deposition process includes electroplating.

The term "electrode" as used herein refers to a component of an electrochemical cell in contact with an electrolyte through which current can flow by electronic movement. Electrodes can comprise one or more electrically conductive materials, including (but not limited to) one or more of: silver, lead, zinc, copper, iron, nickel, mercury, graphite, gold, palladium or platinum, and metal oxides, and alloys thereof.

As used herein, the term "electrolyte" refers to a liquid, gelatinous, polymeric, and/or membrane material through which the transport of ions can be carried when exposed to the electric field. Suitable electrolytes include electroplating solutions.

The term "electroplating" as used herein refers to a process of producing a metallic coating on a surface. Particularly, electroplating involves the deposition of a metallic coating onto an object by immersing it into a solution that includes a salt of the metal to be deposited and applying a negative charge onto the object. The metallic ions of the salt carry a positive charge and are thus attracted and reduced to the state of pure metal and bond to the object. Similarly, the electroplating can be performed by providing metal ions to the substrate via gelatinous, polymeric, and/or membrane materials.

The term "electric field" as used herein refers to a region around a charged particle or object within which a force would be exerted on other charged particles such as metal ions.

As used herein, the term "seed layer" SL refers to a layer that is deposited on a substrate to provide electrical conductivity, promote adhesion, enhance nucleation, and/or to obtain a desired crystal orientation during subsequent deposition (typically of the same material). For example, a copper seed layer can be deposited to a substrate to provide a thin seed layer that ensures proper nucleation during subsequent copper application by electroplating. In some embodiments, herein, the SL defines the pattern on the substrate that is upgraded to the specific conductivity by metallization, regardless of the makeup of the seed layer.

The term "substrate" as used herein refers to any element that (totally or in patterns) can receive deposition according to one or more embodiments of the presently disclosed subject matter, such as (but not limited to) printed circuit boards, flexible electronic substrates and discrete electronic devices. In some embodiments, the substrate can comprise carbon, such as used in flexible electronics, or other high resistance materials.

The term "working electrode" as used herein refers to the electrode that performs the electroplating described in the presently disclosed subject matter.

II. Apparatus 5

II.A. Generally

The presently disclosed apparatus and method offer the capability to electroplate desired metals (such as pure metals or alloys) onto a substrate that does not have current collectors or is provided with current collectors of limited conductivity (e.g., 1e-5S). Thus, in the presence of a substrate comprising a patterned seed layer (e.g., having resistance even up to one kilo-ohm cm), the disclosed method provides the capability to electroplate metals (such as silver or copper) to convert the high resistance seed layer to a highly conductive electroplated pure metal with a thickness of a few microns. In addition, the method enables simplifying and expediting the process of trench filling in the IC device fabrication process. Further, the disclosed system and method enables surface finishing by electroplating isolated electronic devices with desired metals including nickel, gold, silver, and palladium.

Figure 1B:
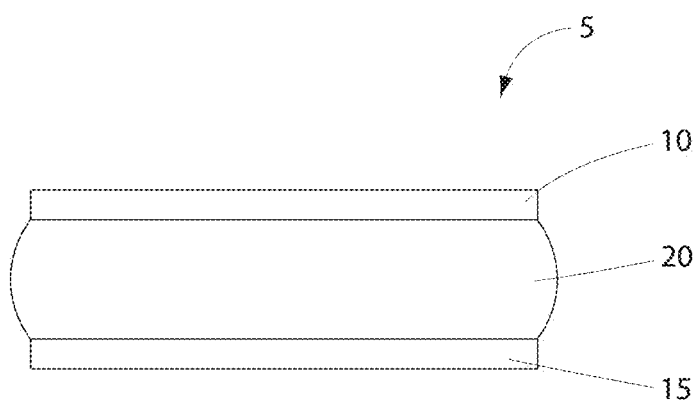

FIGS. 1a and 1b illustrate one embodiment of apparatus 5 that can be used in accordance with the disclosed contact electroplating method. Particularly, apparatus 5 can comprise a sandwich structure that includes counter electrode 10 and working electrode 15 positioned on either side of porous or ion conductive material 20, as set forth in more detail herein below. Apparatus 5 can be configured such that the working electrode is positioned adjacent to a substrate for direct contact electroplating. It should be appreciated that the Figures herein are not necessarily drawn to scale. It should also be appreciated that apparatus 5 can be configured in a variety of different ways and is not limited to the embodiment shown in FIGS. 1a and 1b.

II.B. Counter Electrode 10

Figure 2A:
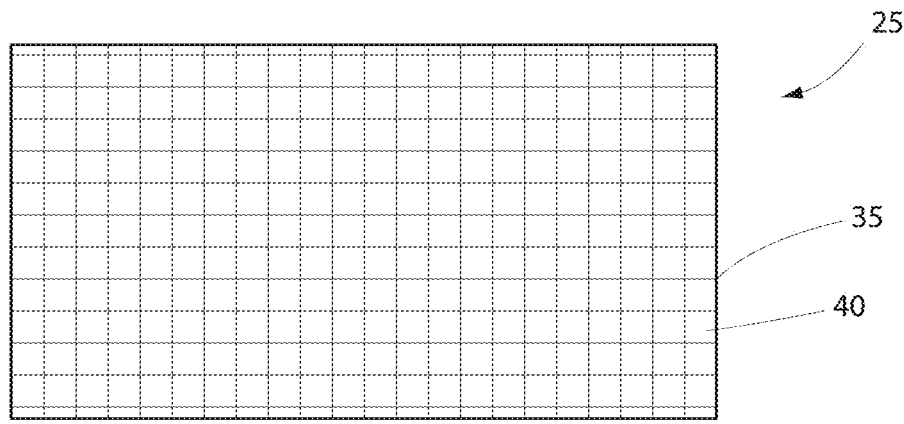
FIGS. 2a and 2b are top elevation views of course mesh and fine mesh in accordance with some embodiments of the presently disclosed subject matter.
Figure 2B:
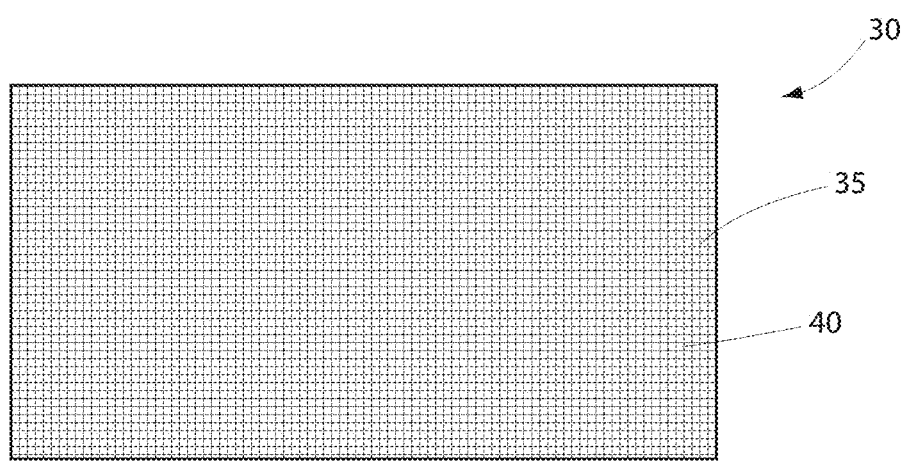

As set forth above, apparatus 5 comprises counter electrode 10. In some embodiments, counter electrode 10 can be constructed from course mesh material 25 (Type-A Configuration) or from metal fiber cloth, metal web, or fine metal mesh material 30 (Type-B Configuration), as shown in FIGS. 2a and 2b, respectively. As shown, course metal mesh and fine metal mesh materials 25, 30 include solid regions 35 and open regions 40. In general, solid regions 35 can be formed from any electrically conductive material known or used in the art. The area of region 40 occupied by mesh materials 25, 30 can be selected as desired. For example, for coarse mesh material 25, the open region can be about 10% to about 90% of the total area of the mesh material, such as at least (or no more than) about 10, 15, 20, 25, 30, 35, 40, 45, 50, 55, 60, 65, 70, 75, 80, 85, or 90% of the total area of the mesh material. Similarly, in some embodiments, the open region can be about 1% to about 40% of the total area of fine mesh material 30, such as at least (or no more than) about 1, 2, 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, or 40% of the total area of the fine mesh material.

For example, in some embodiments, fine metallic mesh material 30 includes openings 40 in the range of about 0.018 mm to about 2 mm, such as about 0.018 to 2.0 mm, 0.019 to 1.6 mm, 0.020 to 1.25 mm, 0.021 to 1.0 mm, 0.022 to 0.75 mm, 0.023 to 0.50 mm, 0.024 to 0.30 mm, or 0.025 to 0.20 mm. Thus, the fine mesh material can have openings in size of at least (or no more than) about 0.018, 0.019, 0.020, 0.03, 0.04, 0.05, 0.06, 0.07, 0.08, 0.09, 0.10, 0.15, 0.20, 0.25, 0.30, 0.35, 0.40, 0.45, 0.50, 0.55, 0.60, 0.65, 0.70, 0.75, 0.80, 0.85, 0.90, 0.95, 1.0, 1.05, 1.10, 1.15, 1.20, 1.25, 1.30, 1.35, 1.40, 1.45, 1.50, 1.55, 1.60, 1.65, 1.70, 1.75, 1.80, 1.85, 1.90, 1.95, or 2.0 mm.

In some embodiments, course mesh material 25 includes openings in the range of about 1-20 mm, such as about 3-15 mm or 6-12 mm. Thus, course metallic mesh 25 can include openings 40 in the size of at least (or no more than) about 1, 1.5, 2, 2.5, 3, 3.5, 4, 4.5, 5, 5.5, 6, 6.5, 7, 7.5, 8, 8.5, 9, 9.5, 10, 10.5, 11, 11.5, 12, 12.5, 13, 13.5, 14, 14.5, 15, 15.5, 16, 16.5, 17, 17.5, 18, 18.5, 19, 19.5, or 20 mm. However, it should be appreciated that in some embodiments the counter electrode can be constructed from a solid metal (copper or silver, e.g.) such that no openings are needed.

Open areas 40 are depicted as having a square shape in the figures. However, it should be appreciated that the open areas can have any desired shape (e.g., square, circle, semicircle, triangle, diamond, ellipse, trapezoid, irregular shape, and the Ike). In some embodiments, the open areas have a uniform shape (i.e., all open areas are the same shape). However, the presently disclosed subject matter also includes embodiments wherein the open areas vary in shape (i.e., some open areas are square-shaped and some are circular-shaped, for example).

In some embodiments, fine mesh material 30 can have a thickness of about 0.046-1.5 mm, such as at least (or no more than) about 0.046, 0.05, 0.06, 0.07, 0.08, 0.09, 0.1, 0.15, 0.2, 0.25, 0.3, 0.35, 0.4, 0.45, 0.5, 0.55, 0.6, 0.65, 0.7, 0.75, 0.8, 0.85, 0.9, 0.95, 1.0, 1.05, 1.1, 1.15, 1.2, 1.25, 1.3, 1.35, 1.4, 1.45, or 1.5 mm.

In some embodiments, course mesh material 25 can have a thickness of about 1.5-2.5 mm, such as at least (or no more than) about 1.5, 1.6, 1.7, 1.8, 1.9, 2.0, 2.1, 2.2, 2.3, 2.4, or 2.5 mm.

The fine metallic mesh material can include (but is not limited to) perforated, expanded, or metal wire cloth, fiber cloth, and/or web.

Mesh materials 25, 30 can be prepared using various methods, as would be known to those of skill in the art. For example, in some embodiments, mesh materials 25, 30 can be formed by weaving wires of material and/or welding wires of metal to form solid regions 35. In some embodiments, the meshes can be prepared by removing open regions 40 (e.g., via laser removal, chemical etching, puncturing, and the like) from a sheet of material (e.g., an electrically conductive material, such as a metal), followed optionally by stretching the sheet (e.g., stretching in one or two dimensions). Thus, in some embodiments, mesh materials 25, 30 can be a perforated, expanded, and/or metal wire cloth material. For example, in some embodiments, the fine mesh wire used to construct fine mesh material 30 can be about 0.023 mm to about 1.0 mm, such as about 0.025 mm to about 0.5 mm. Further, metal wire cloth suitable for forming fine metal mesh material 30 can be about 0.046 mm to about 2.0 mm.

Mesh materials 25, 30 can be formed from one or more chemically stable, insoluble, electrically conductive materials, such as metals, alloys, and/or electrically conductive polymers. For example, suitable electrically conductive metals can include (but are not limited to) gold, silver, platinized or Au plated copper or nickel, palladium, and/or platinum. Suitable electrically conductive alloys can include (but are not limited to) Pt or Au plated stainless steel, alloys of gold, alloys of silver, alloys of copper, alloys of nickel, alloys of palladium, alloys of platinum, and/or alloys thereof, or specially prepared titanium with noble metal oxides such as platinum or ruthenium. In some embodiments, combinations of electrically conductive materials can be used. For example, in some embodiments, fine metal mesh material 30 can be constructed from platinized titanium or gold plated stainless steel. In some embodiments, the counter electrode can have resistance of less than about 0.0001 ohm-cm.

Depending on the thickness, mesh materials 25, 30 can be flexible, semi-flexible, semi-rigid, or inflexible.

While shown as having a rectangular shape in the drawings, mesh materials 25, 30 can generally have any desired shape (e.g., square, circle, semicircle, triangle, diamond, ellipse, trapezoid, irregular shape, and the like). In some embodiments mesh materials 25, 30 can have the same shape or can differ in shape.

II.C. Working Electrode 15

Figure 3:
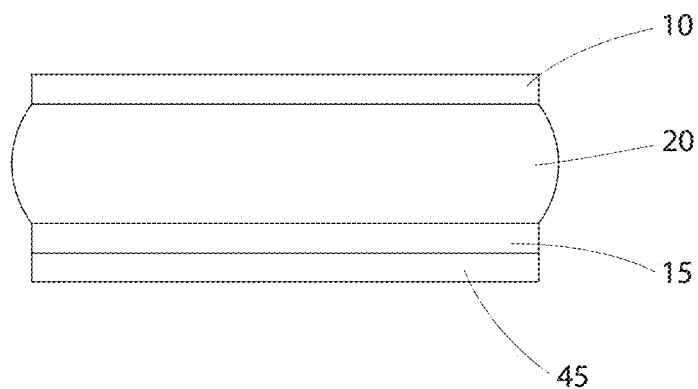
FIG. 3 is a front sectional view of the apparatus of FIG. 1a positioned with a substrate in accordance with some embodiments of the presently disclosed subject matter.

Assembly 5 comprises working electrode 15 positioned to electroplate substrate 45 by direct contact, as shown in FIG. 3. Thus, in some embodiments, the apparatus is configured such that working electrode 15 is positioned adjacent to (i.e., contacting) substrate 45 when in use.

Working electrode 15 can be constructed from any of the wide variety of highly conductive materials known and used in the art. For example, in some embodiments, the working electrode can be constructed from gold, silver, copper, nickel, palladium, platinum, titanium, stainless steel, alloys of gold, alloys of silver, alloys of copper, alloys of nickel, alloys of palladium, alloys of platinum, and/or platinized titanium. In some embodiments, the working electrode can have resistance of less than about 0.0001 ohm-cm.

In some embodiments, working electrode 15 can comprise metal fiber cloth, metal web, and/or fine metal mesh material (which in some embodiments can include polymeric material, i.e., about 50, 40, 30, 20, 10, 5, 4, 3, 2, or 1 weight percent polymeric material). Conductive fiber cloth can include carbon fiber cloth, graphite fiber cloth, and/or cloth formed from any other conductive metal material, such as stainless steel. For example, SS316 web produced by Bekaert Corp., "Bekinox", made from 11 micron fibers can be used. By using two meshes (e.g., openings 1-10 mm$^2$ and preferably with thin wire diameters e.g. 0.1 to 1.0 mm) described earlier, a user can sandwich 0.001-0.1 gram/cm$^2$ fibers in between. The structure can be assembled using techniques known in the art (such as tack welding, spot welding and/or roller resistance welding) and form web/mesh composite to be applied on substrates with substantial relief, e.g., discrete electronic devices. A similar structure produced by Bekaert Corp. under the trade name BEKIPORE®, produced by sintering fibers, is an example of one working electrode that can be used in accordance with the presently disclosed subject matter. It should be appreciated that the above structure must be plated with noble metals, such as gold or platinum, prior to use. A combination of SS 316 fibers with polymer thread used in conductive textile material such as one produced by Bekaert can be utilized as the building material for working electrodes upon gold plating of the SS fiber portion of the structure. Fine mesh materials are included above in the discussion of counter electrode 10.

In some embodiments, the working electrode has a thickness of about 1.5 mm or less, such as no more than (or no less than) about 1.5, 1.45, 1.4, 1.35, 1.3, 1.25, 1.2, 1.15, 1.1, 1.05, 1.0, 0.95, 0.9, 0.85, 0.8, 0.75, 0.7, 0.65, 0.6, 0.55, 0.5, 0.45, 0.4, 0.35, 0.3, 0.25, 0.2, 0.15, 0.1, 0.05, 0.04, 0.03, 0.02, 0.01, 0.001.

II.D. Material 20

As set forth above, counter electrode 10 and working electrode 15 are positioned on either side of porous or ion conductive material 20. As used herein, the term "porous" includes any of the wide variety of materials that have sufficient permeability to permit an acceptable degree of ion flow therethrough to support electrochemical discharge. Material 20 should also allow for providing the mobility of electrolyte within the structure and at the contact with the substrate under compression/release action (sponge). In some embodiments, material 20 can have a predominant pore distribution in the mesoporous range (pore diameter of about 2-50 nm), macroporous range (pore diameter of about 50 nm-200 nm), and/or microporous range (pore diameter of about 0.1 nm to 2 nm). Depending on the selection of material 20, the pore size can vary from 3-4 mm to nanometer in size.

In some embodiments, material 20 has a porosity of about 30% to 99%, such as about 45-98%, 50-97%, 55-96%, 60-95%, 65-94%, or 60-93%. Thus, the porosity of material 20 can be no more than (or no less than) about 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 82, 83, 84, 85, 86, 87, 88, 89, 90, 91, 92, 93, 94, 95, 96, 97, 98, or 99%. Advantageously, material 20 can be impregnated with or absorb electrolytic solution.

In some embodiments, material 20 is chemically inert (i.e., is nonreactive with and is left undamaged by contact with a chemical or chemical solution). In some embodiments, the ion conductive (porous) material 20 can be a membrane, gelatinous electrolyte, or polymer electrolyte. In some embodiments, material 20 is flexible. As used herein, the term "flexible" refers to the ability of a material to be pliant and readily conform to a desired shape.

In some embodiments, material 20 can be selected from textile, pile-type cloth, synthetic polymer, and/or sponge (natural or synthetic). For example, in some embodiments, material 20 can comprise a porous polymer sponge or pile cloth material. In embodiments wherein material 20 comprises a cloth material, the material can be napped or non-napped. Napped fabrics include those having a smooth surface on one side and a napped or fuzzy surface on the opposite side. In some embodiments, when used with the presently disclosed subject matter, the napped fabrics can be positioned such that the smooth side is posited adjacent to counter electrode 10 and/or working electrode 15 to avoid interference with transfer of electrolyte and penetration of electric field.

In some embodiments, material 20 can have a thickness of about 0.1-50 mm, such as about 1-10 mm. Thus, material 20 can have a thickness of at least (or no more than) about 0.1, 0.2, 0.3, 0.4, 0.5, 0.6, 0.7, 0.8, 0.9, 1.0, 1.25, 1.5, 1.75, 2.0, 2.25, 2.5, 2.75, 3.0, 3.25, 3.5, 3.75, 4.0, 4.25, 4.5, 4.75, 5.0, 5.25, 5.5, 5.75, 6.0, 6.25, 6.5, 6.75, 7.0, 7.25, 7.5, 7.75, 8.0, 8.25, 8.5, 8.75, 9.0, 9.25, 9.5, 9.75, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, or 50 mm.

III. Assembly of Apparatus 5

As set forth above, apparatus 5 can comprise a sandwich structure that includes counter electrode 10 and working electrode 15 positioned on either side of material 20. Apparatus 5 is configured such that working electrode 15 is positioned adjacent to a substrate for direct contact electroplating. In some embodiments, the overall structure of apparatus 5 can be about 0.5 mm to about 50 mm thick, such as at least (or no more than) about 0.5, 1, 2, 3, 4, 5, 6, 7, 8, 9, 10, 15, 20, 25, 30, 40, 45, or 50 mm. In some embodiments, apparatus 5 can comprise at least one side that is about 20 to 610 mm wide, such as at least (or no more than) about 20, 25, 30, 35, 40, 45, 50, 55, 60, 65, 70, 75, 80, 85, 90, 95, 100, 105, 110, 115, 120, 125, 130, 135, 140, 145, 150, 155, 160, 165, 170, 175, 180, 185, 190, 195, 200, 205, 210, 215, 220, 225, 230, 235, 240, 245, 250, 255, 260, 265, 270, 275, 280, 285, 290, 295, 300, 350, 400, 450, 500, 550 or 610 mm. Apparatus 5 can be formed in any desired shape, including (but not limited to) a cylinder, rectangle, and the like.

In some embodiments, apparatus 5 can be assembled in an "A-type" configuration, wherein counter electrode 10 is constructed from course mesh material 25. Particularly, mesh material 25 is configured as the anode portion of the apparatus and working electrode 15 is configured as the cathode portion of the apparatus. Alternatively, in some embodiments, apparatus 5 can be assembled in a "B-type" configuration, wherein counter electrode 10 and working electrode 15 are both constructed from fiber cloth, web, and/or fine metal mesh material 30.

Figure 4:
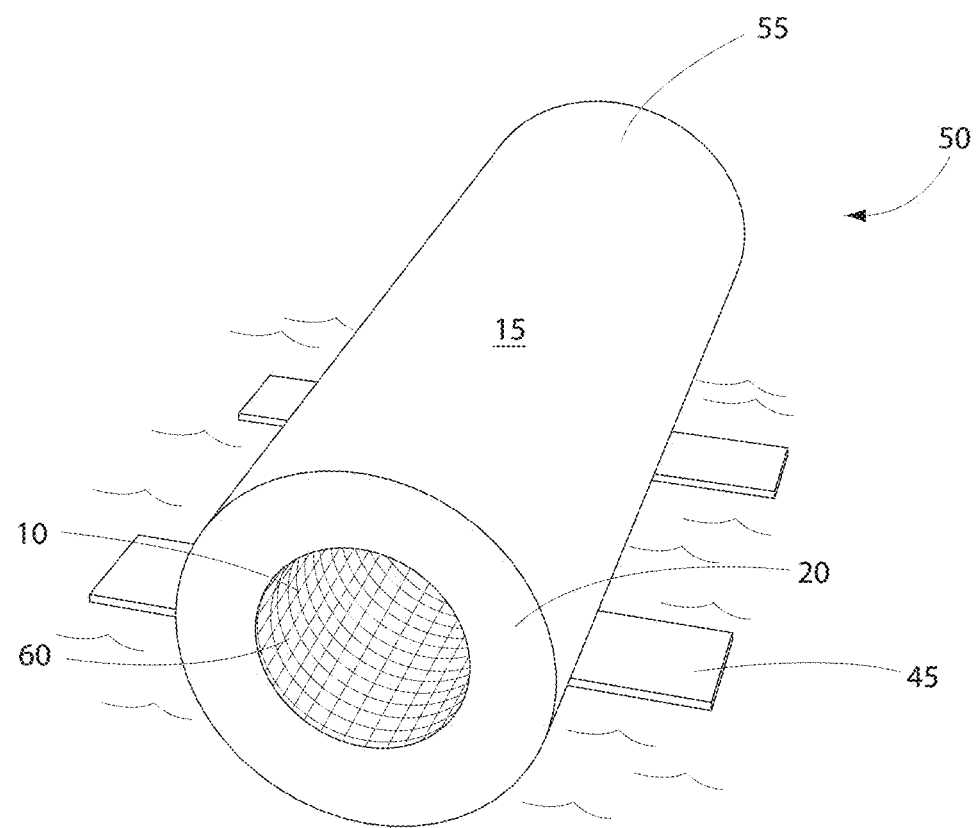
FIG. 4 is a perspective view of a roller apparatus in accordance with some embodiments of the presently disclosed subject matter.

In addition to the "sandwich" or "pad" type configuration illustrated in FIGS. 1a and 1b, an A-type configuration of apparatus 5 can include roller-type configurations. See, for example U.S. Pat. Nos. 5,024,735 and 5,114,558, the entire disclosures of which are hereby incorporated by reference. One embodiment of roller configuration is illustrated in FIG. 4, showing roller 50 with working electrode 15 positioned on outer surface 55 of the roller, adjacent to substrate 45, and counter electrode 10 positioned on inner surface 60 of the roller. Material 20 is positioned between electrodes 10, 15. By varying compression to the roller, a user can optimize the plating duration, e.g., higher compression allows for faster throughput.

Figure 5:
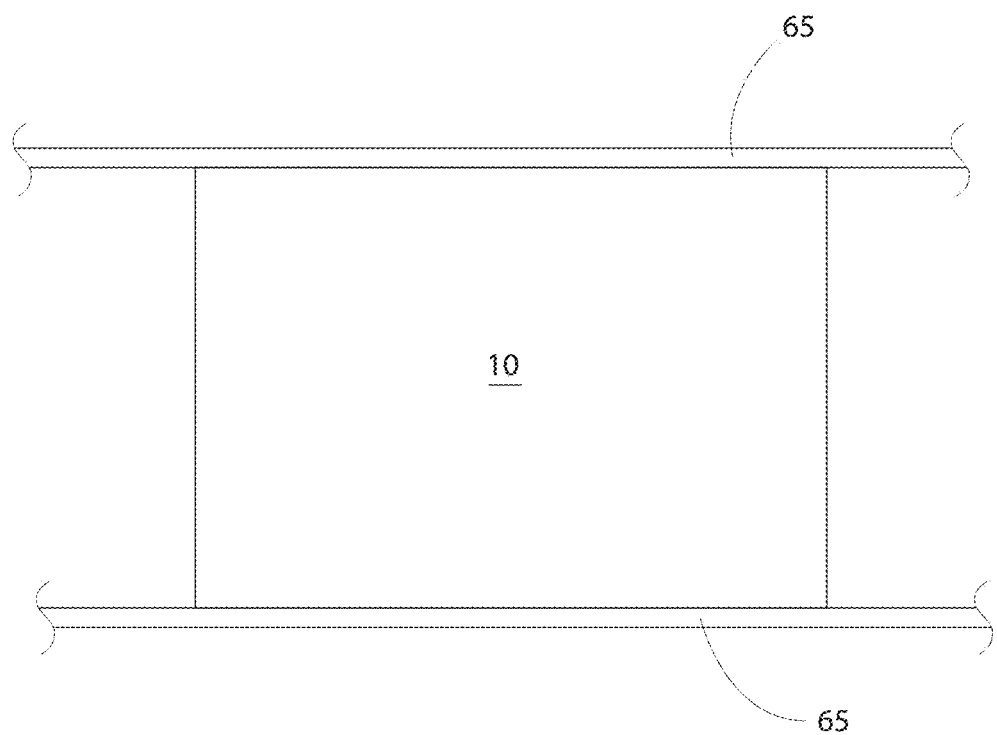
FIG. 5 is a top planar view of an electrode comprising current collectors in accordance with some embodiments of the presently disclosed subject matter.

In some embodiments, current collectors 65 can be attached to counter electrode 10 and working electrode 15 to link the electrodes to the respective polarity of a power supply, as shown in FIG. 5. Thus, in some embodiments, apparatus 5 comprises at least one current collector in electrical communication with a facing area of at least one of electrodes 10, 15. Any the wide variety of current collectors known and used in the art can be used. For example, in some embodiments, current collector 65 can comprise a copper wire or a metal foil laminated with chemically protective layers. Current collector 65 can cover at least a portion of counter electrode 10 and/or working electrode 15 to provide an optimum contact area with which to distribute the current.

Figure 6A:
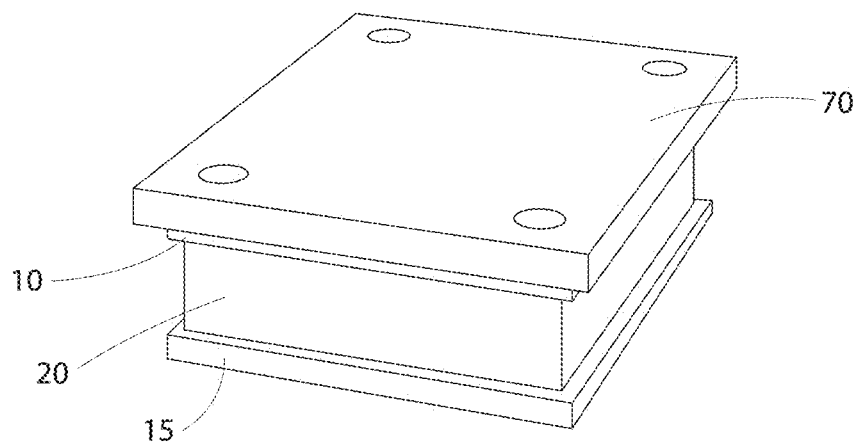
FIG. 6a is a perspective view of an apparatus comprising a reinforcing element in accordance with some embodiments of the presently disclosed subject matter.

In some embodiments, the A-type configuration of apparatus 5 can be reinforced with a rigid material. For example, as illustrated in FIG. 6a, apparatus 5 can comprise reinforcing element 70, positioned adjacent to counter electrode 10. As shown in FIG. 6a, reinforcing element 70 can be positioned on the outer edge of apparatus 5 (i.e., facing away from the remainder of the apparatus). It should be appreciated that FIG. 6a illustrates one non-limiting example, and that reinforcing element 70 can be configured, shaped, and/or positioned in any of a variety of different ways.

Suitable rigid materials that can be used to construct reinforcing element 70 can include (but are not limited to) one or more polypropylenes, polyethylenes, polyamides, polycarbonates, polyesters, polyester ethers, polyester elastomers, polystyrenes, acrylonitrile, polyethylene terephthalate (PET). TEFLON® coated metal beams/blocks, or any other rigid polymer material known or used in the art.

Figure 6B:
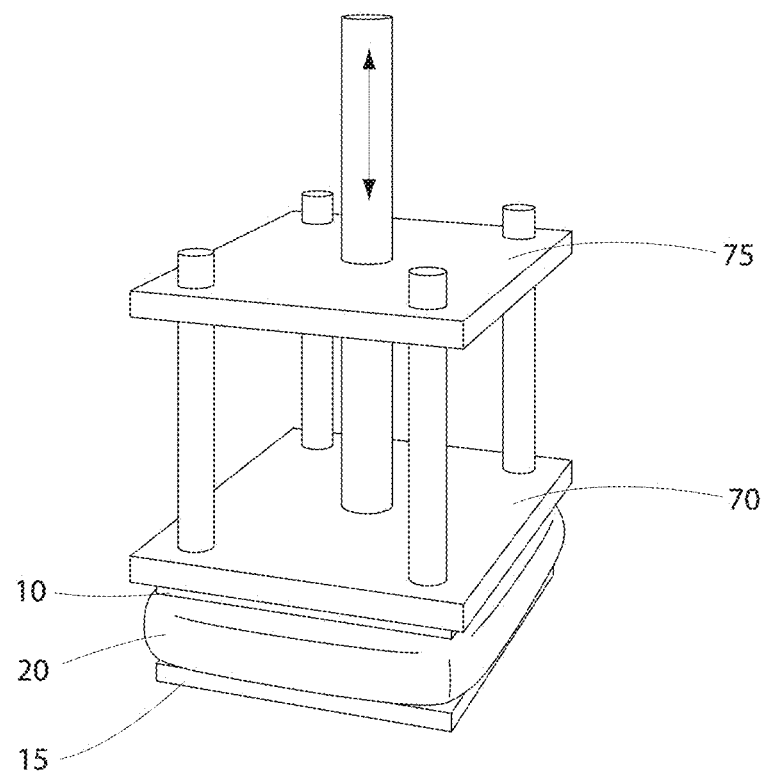
FIG. 6b is a perspective view of the apparatus of FIG. 6a, additionally comprising a vibratory element.

Alternatively or in addition to the reinforcing element, apparatus 5 can comprise compression pad 75, which in some embodiments can be configured as a detachable perforated chemically-stable rigid polymer material. In some embodiments, compression pad 75 ensures uniform compression and vibratory motion of the apparatus, as shown in FIG. 6b. In some embodiments, the compression pad comprises a frequency in the range of about 1-100 Hz and amplitude in the range of about 0.64-6.4 mm.

Figure 7A:
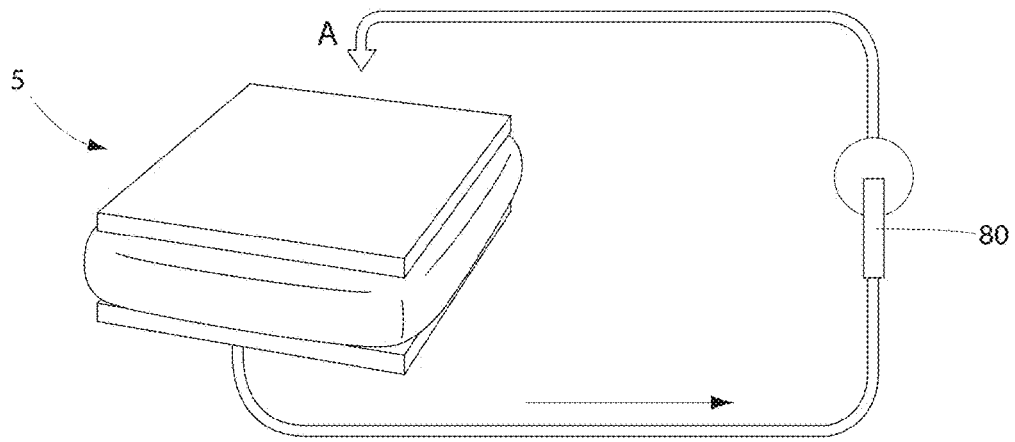
FIGS. 7a and 7b are top planar views, showing perpendicular and parallel flow of electrolyte relative to the apparatus in accordance with some embodiments of the presently disclosed subject matter.
Figure 7B:
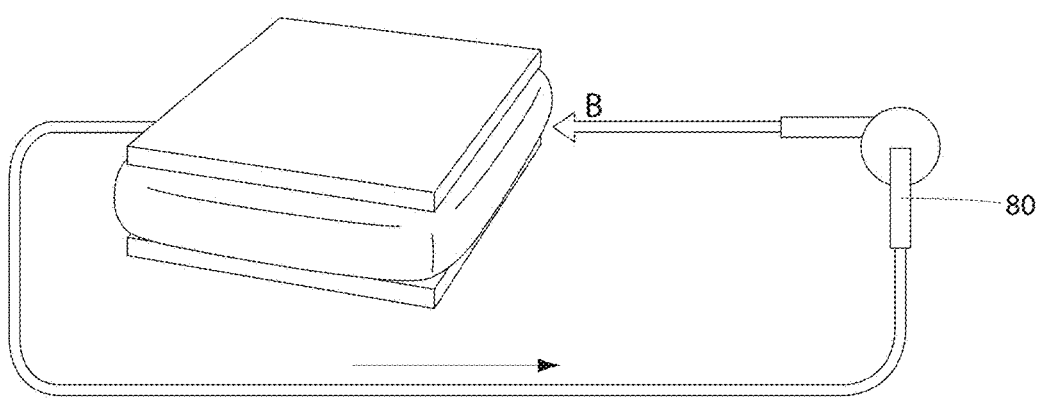

In some embodiments, apparatus 5 comprises recirculating element 80 that functions to recirculate electrolyte through the structure. For example, in some embodiments, a recirculation pump can be fluidly coupled with the discharge stream, as would be known in the art. Electrolyte flow can be perpendicular to the plane of apparatus 5, as shown by Arrow A in FIG. 7a. Alternatively, in some embodiments, electrolyte flow can be configured parallel to the plane of apparatus 5, as shown by Arrow B in FIG. 7b. It should be appreciated that recirculating element 80 can include any of the wide variety of recirculating elements known and used in the art, including (but not limited to) pumps.

Figure 8A:
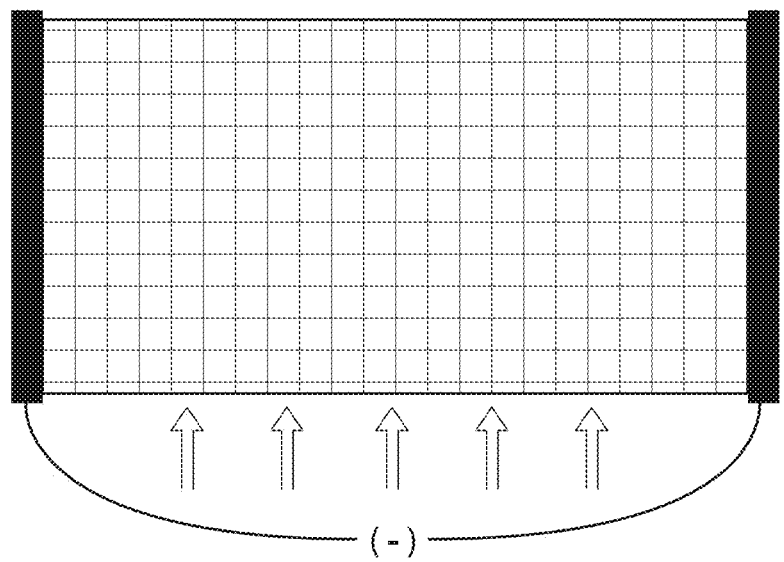
FIGS. 8a and 8b are top planar views of working electrodes in accordance with some embodiments of the presently disclosed subject matter.
Figure 8B:
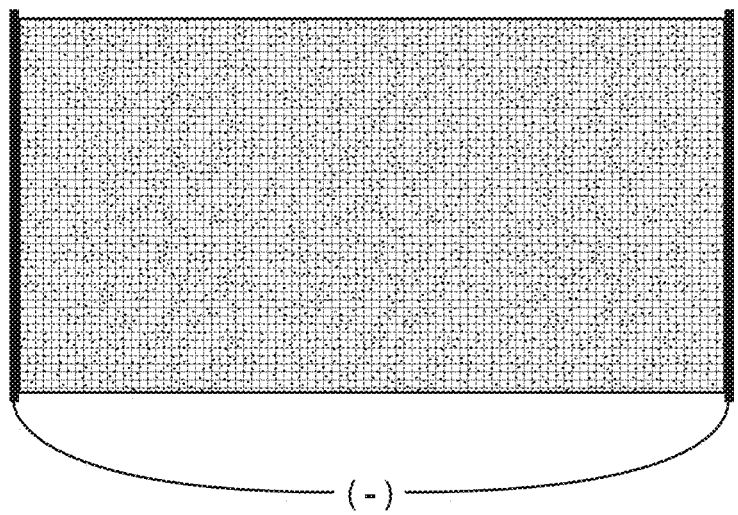

In some embodiments, apparatus 5 can be equipped with a power supply connected to the respective polarity of electrodes 10, 15. In some embodiments, the power supply has a forward and reverse pulse capability of about 0.01-10,000 Hz. FIG. 8a illustrates one embodiment of current collector to provide uniform current feed to the working electrode (i.e., fine mesh in some embodiments) during use. FIG. 8b illustrates one embodiment of an electrical connection of working electrode 15 comprising stainless steel web (see detailed description II.C.) for application on substrates with coarser profile patterns, such as for use in surface finishing of electronic devices (i.e., discrete surface mount packages or other three dimensional structures, for example).

Figure 9:
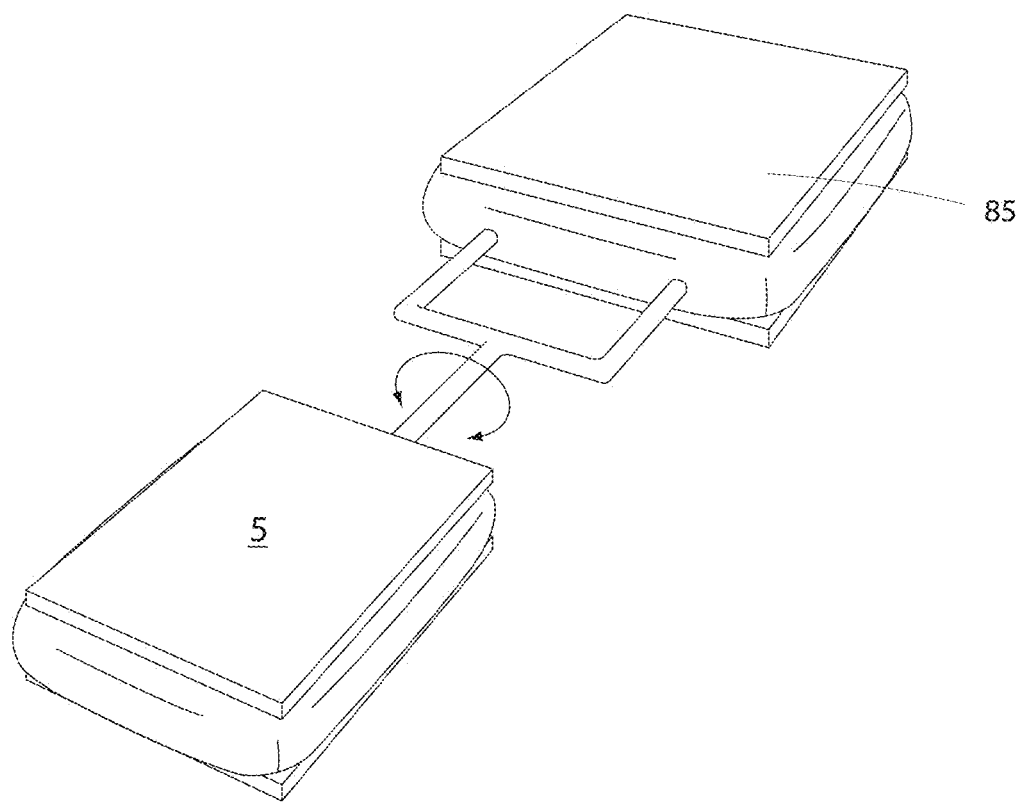
FIG. 9 is a perspective view of one embodiment of an apparatus comprising a flipping element in accordance with some embodiments of the presently disclosed subject matter.

In embodiments, wherein apparatus 5 is assembled in the B-type configuration, the apparatus can comprise flipping element 85 that functions to flip the apparatus 180 degrees (i.e., rotate the apparatus so that the working electrode and counter electrodes swap positions), as shown in FIG. 9. Particularly, flipping element 85 can be timed and synchronized with a power supply to flip the orientation of the apparatus relative to substrate 45. Flipping element 85 can comprise any element known or used in the art to enable flipping of apparatus 5 (i.e., from an orientation where working electrode 15 is positioned adjacent to substrate 45, to an orientation where counter electrode 10 is positioned adjacent to substrate 45). Flipping element 85 can include any device known or used in the art capable of flipping apparatus 5. Ripping element 85 can be associated with a predetermined time sequence in some embodiments.

IV. Methods of Using Apparatus 5

Apparatus 5 can be used with any of a wide variety of substrates known and used in the art, such as (but not limited to) flexible printed circuitry, printed wiring boards, discrete electronic devices, and IC wafers. Thus, the presently disclosed subject matter has particular utility in connection with electro-deposition of metal onto flexible electronic circuitry, printed circuit boards, IC processing and the like and will be described in connection with such utility, although other utilities are contemplated.

As set forth above, the presently disclosed subject matter relates to electroplating metal on a substrate. Thus, in some embodiments, substrate 45 can be a patterned substrate with pattern defined with seed layer having resistance in the range of about 0.001 ohm-cm to about 100,000 ohm-cm (100 kilo-ohm-cm). In some embodiments, substrate 45 comprises patterns of width and/or length of about 0.001 mm (1 micron) to 150 mm, such as (but not limited to) at least about 0.02 mm long and about 0.001 mm wide. In some embodiments, any semiconductor substrate wafer with conductive seed layer over the damascene lithography for IC fabrication can be used.

During use, material 20 is contacted with (i.e., soaked with, in some embodiments) electrolyte solution to establish the electrolytic circuit between electrodes 10, 15. In some embodiments, the electrolyte can be supplied through an external electrolyte supply, or apparatus 5 can be immersed in electrolyte solution, such as a shallow container.

While in operation, working electrode 15 of apparatus 5 in the A-type configuration is pressed against the patterned seed layer (or any other isolated pattern) of substrate 45 to establish intimate contact. The term "seed layer" refers to a layer (i.e., a film) that is deposited on the substrate, and is the layer to which a predetermined voltage is applied when the seed layer and the electroplated mesh are in a state of contact. Any electroplating solution known in the art can be used, such as electroplating solution comprising a source of ions to be deposited on the surface of the substrate.

Figure 10:
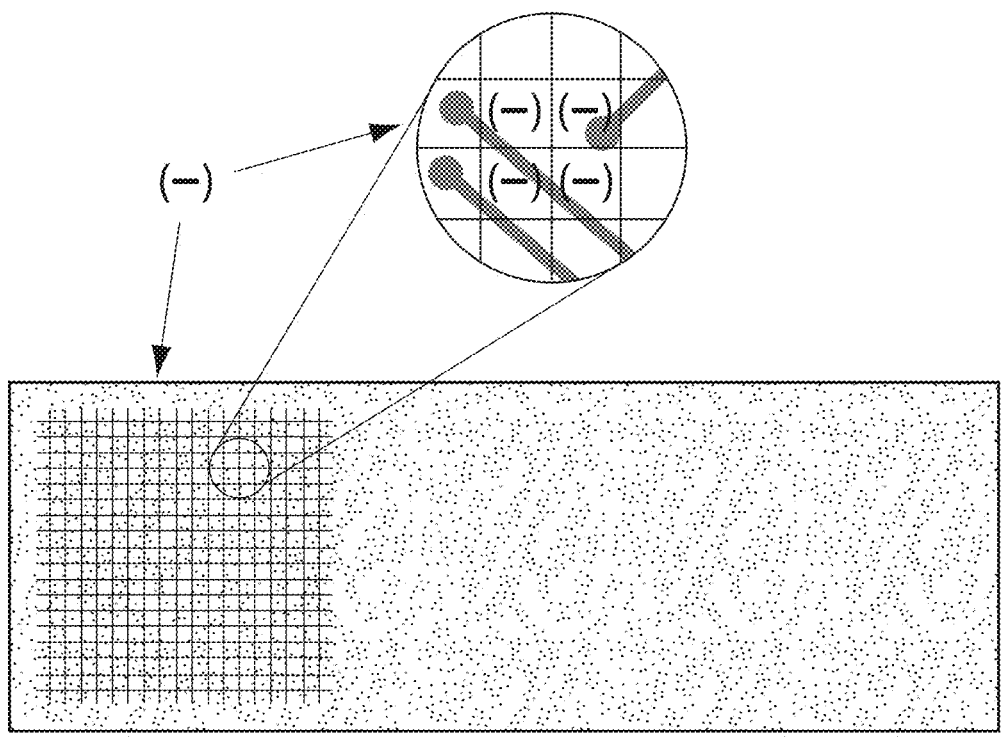
FIG. 10 is a top planar view of a substrate in the process of being plated in accordance with some embodiments of the presently disclosed subject matter. It is a schematic presentation regarding electric field and metal ions electrolyte accessibility to the isolated patterns or devices.

The power supply (DC or reverse pulse current) provides the electric field between counter electrode 10 and working electrode 15 via electrolyte-soaked material 20. Prior to establishing an intimate contact with the substrate the working electrode must be pre-plated with 1-2 microns of metal. Thus, to deposit metal on the working electrode, the power supply is turned on, which applies a negative charge. Since the working electrode is then negatively charged, it will be exposed to deposition of the electroplated material (i.e., metal). The metal ions carry a positive charge and as such are attracted to the working electrode and, reduced to pure metal atoms and deposited for 2-4 seconds to the fiber cloth, web, and/or fine metal mesh material of the working electrode. Following this preparation step the working electrode is placed in close uniform contact with the seed layer patterns formed over substrate 45. Due to electric field propagation beyond the working electrode and since the working electrode is negatively charged it imposes the negative polarization to the substrate causing the discharging of the metal ions and electroplating of the seed layer. In some embodiments, the DC or reverse pulse electroplating proceeds for about 2-15 seconds to achieve the necessary conductivity and/or surface finishing of the patterns. In embodiments without vibratory motion, deposition can be achieved for selected substrates and metals in about 2-4 seconds. Thus, the conversion of a low conductivity seed layer of e.g. carbon to a highly conductive (99.99% pure metal/silver or metal/copper, in some embodiments) substrate is achieved, as shown in FIG. 10. The apparatus is then released after deposition and the new substrate is introduced.

In some embodiments, a vibratory motion is provided simultaneously with starting the electroplating process to enable proper exchange of matter at the interface of the working electrode and the substrate. In some embodiments, the vibratory motion can include motions of less than 5 mm amplitude at speeds of less than 5 cm/sec to provide an electrolyte supply needed for exchange of matter and yet low enough to prevent excessive lateral flow/discharge of electrolyte (i.e., less than 5, 4, 3, 2, or 1 mm at speeds of less than 5, 4, 3, 2, or 1 cm/sec). In some embodiments, the vibratory motion is provided perpendicularly to the plane of the substrate. In some embodiments, the vibratory motion can be supplied by any mechanical or pneumatic action device known or used in the art.

When apparatus 5 is in the B-type configuration, the working electrode or counter electrode of apparatus 5 contacts the seed layer (or any other isolated pattern) of substrate 45, submerged in electroplating solution. To deposit metal on the working electrode or counter electrode (whichever one is in contact with the seed layer of the substrate), the power supply is turned on, which applies a negative charge. Since the electrode in contact with the seed layer is then negatively charged, it will impose cathodic polarization to the seed layer and cause deposition of metal on the seed layer. Thus, the metallic ions of the metal in the electroplating solution carry a positive charge and thus are attracted to and bond the fiber cloth, web, and/or fine metal mesh material of the electrode in contact with the substrate. Further, since the electrode is in close uniform contact with the seed layer patterns formed over substrate 45, the seed layer is also electroplated. The electroplating is proceeding as long as needed to obtain specified conductivity or until the predetermined time limit to prevent overloading the working electrode 30 with plated metal (see below). The apparatus is then released after deposition and the new substrate is introduced. The apparatus can be flipped over to perform the plating with the opposite side of the apparatus. In this embodiments, while operating as a plating device on the cathode side of the apparatus, the opposite side (now acting as an anode) anodically dissolves the accumulated deposit on the mesh during cathodic polarization while plating in the previous step.

In the disclosed methods, both the working electrode (or the counter electrode in B-type configurations) and the substrate are intermittently electroplated. Any electroplating process with apparatus of this invention requires establishing the balance between the deposition and dissolution of the metal from the working electrode. If not limited, the effect can cause accumulation of metal at the electrode and thus reduce efficiency of apparatus 5 by reducing the open space available for electrolyte and electric field propagation beyond the electrode. To address the issue of metal accumulation on the working electrode (or counter electrode when positioned adjacent to the substrate), the metal excess from the working electrode in contact with the substrate can be removed by anodic dissolution after a defined thickness of pure metal has been deposited over the substrate pattern (i.e., seed layer pattern). The metal is then automatically accumulated on counter electrode 10 of apparatus 5. The metal is then available as a source of metal for the next application to the seed layer pattern.

In some embodiments, a series of apparatuses 5 can carry the production of the metal plated seed layer patterns while simultaneously accumulating the metal over the working electrode section. In these embodiments, the counter electrode can be the same configuration as the working electrode (B-type). Thus, by flipping the apparatus 180 degrees, a user can continue processing the next series of seed layer patterns on substrate 45. The balance of deposits on the two sides of the apparatus must be established so that no excess is accumulated on either side.

Alternatively or in addition, the working electrode of apparatus 5 can be deplated/dissolved by reverse pulsing application with anodic (positive) polarity imposed to the working electrode (or to the counter electrode in B-type configurations). Accordingly, the continuity of operation of apparatus 5 can be resolved by periodic reverse of the current across the apparatus. As such, direct electroplating with silver or copper or any other metal can be introduced as a conveyorized process for continued production of desired substrates. In this method, both the working electrode of apparatus 5 and the patterned substrate are electroplated. In some embodiments, the proportion of working electrode plating and seed layer plating can be about the same or even higher than the ratio of the surface areas of each. Thus, an excess metal deposition can occur at the working electrode. In some embodiments, the area of the seed layer pattern is in the range of about 20-30% of the area of the electrode, so that a user can expect the working electrode to receive 5 times or more deposit than the seed layer pattern.

Figure 11:
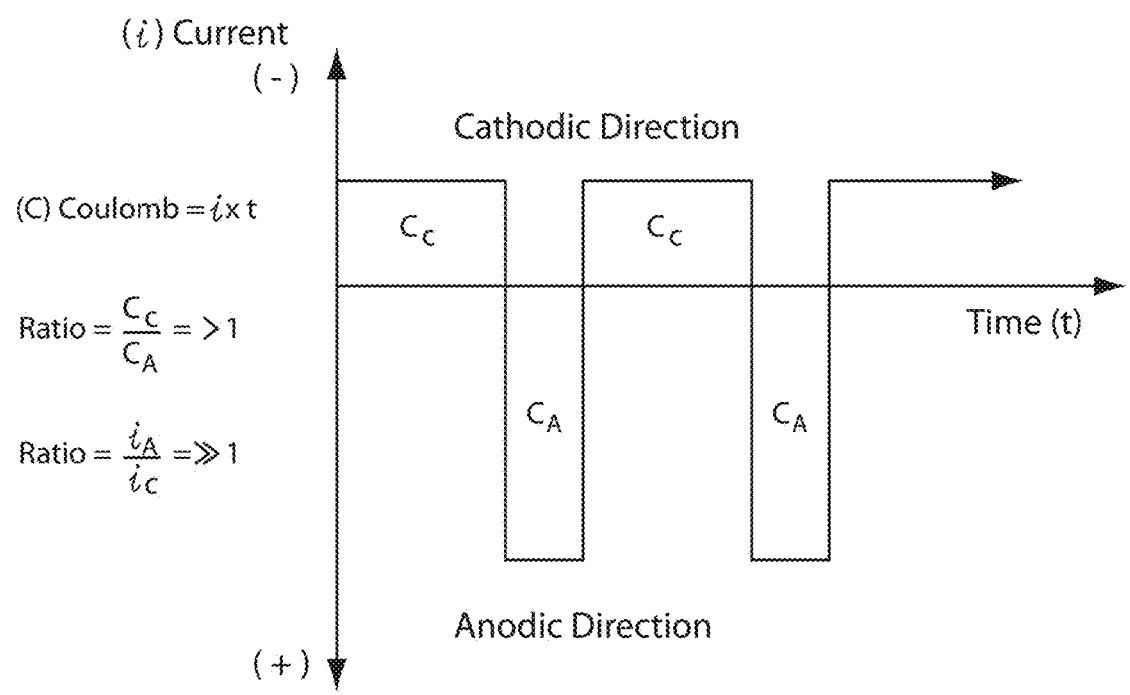
FIG. 11 is a schematic of a reverse pulse operation enabling continuity of the disclosed contact electroplating method in accordance with some embodiments of the presently disclosed subject matter.

FIG. 11 illustrates one embodiment of a schematic of the reverse pulse operation enabling continuity of the disclosed direct electroplating method. As shown the reverse anodic pulse with typically significantly higher current density is designed to strip the excess deposit from the working electrode (i.e., fine mesh in some embodiments) while leaving the majority of the deposit on the seed layer of the substrate. The method of high current anodic pulsing is known in the art of plating microstructures. To counteract the so-called "edge effect" where excess plating occurs on the edges of patterns as a result of electric field preference, periodic introduction of high current anodic pulses are applied to do exactly the opposite by dissolving excess plating on the edges of the pattern.

Reverse pulse plating parameters can be established based on the seeded surface area of the substrate. Particularly, starting pulse parameters can be determined ideally as the ratio of the surface area of the seeded area combined with the area of the fine mesh. For example, if the entire area of the substrate is seeded with a conductive layer, then the area of the substrate plus the area of the mesh are taken in account to be plated in a cathodic direction of the pulse. Anodic direction of the pulse is established then assuming only the area of the mesh requiring deplating. Using the method of high current anodic pulses, recognized in the art of plating of complex microstructures to minimize the edge effect, deplating in the anodic direction can be carried out predominantly over working electrode 15 while preserving the metal deposited on the patterned substrate.

In some embodiments, apparatus 5 can be applied on an essentially dry flexible substrate by having an element within to provide metal ions to the substrate upon contact. Elements such as gelatinous electrolyte or polymer electrolyte are well known to those of ordinary skill in the art. In addition, apparatus 5 can be applied to substrate by applying minimal pressure and utilizing vibratory motion to generate reciprocating flow of electrolyte at the interface, sufficient enough to wet the substrate without flooding in excess. Simultaneous DC or reverse pulse plating can produce deposits of desired metal over the seeded section of the substrate.

Figure 12A:
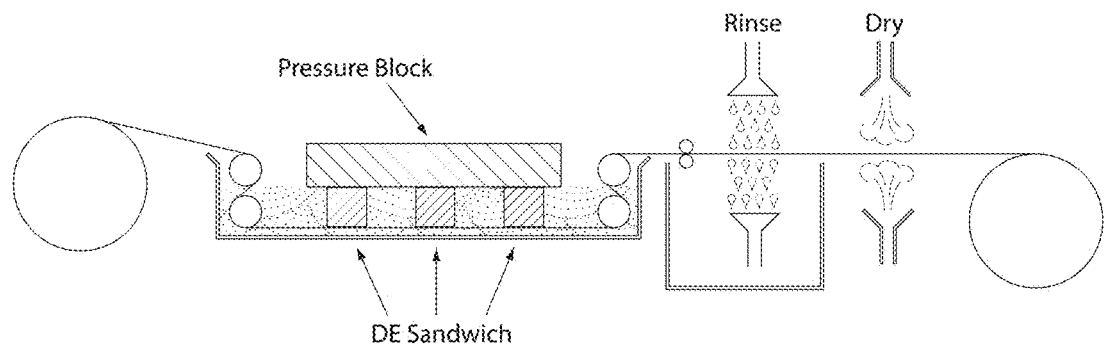
FIGS. 12a and 12b illustrate side sectional views of two conveyorized systems that can be used to process substrates in accordance with some embodiments of the presently disclosed subject matter.

FIG. 12*a* illustrates one embodiment of a conveyorized system that can be used to process substrates with an A-type apparatus. Particularly, FIG. 12*a* illustrates sandwich-type electroplaters immersed in electroplating solution and pressed with a common compression pad. R can be operated in two types of processing: (a) intermittent plating followed by lifting and dissolving excess metal from the working electrode and (b) working with reverse pulse rectifier. Coordinated flow of substrate occurs as per metal deposition specifications. Vibratory motion is optional in some embodiments. Rinsing and drying sections are also included.

Figure 12B:
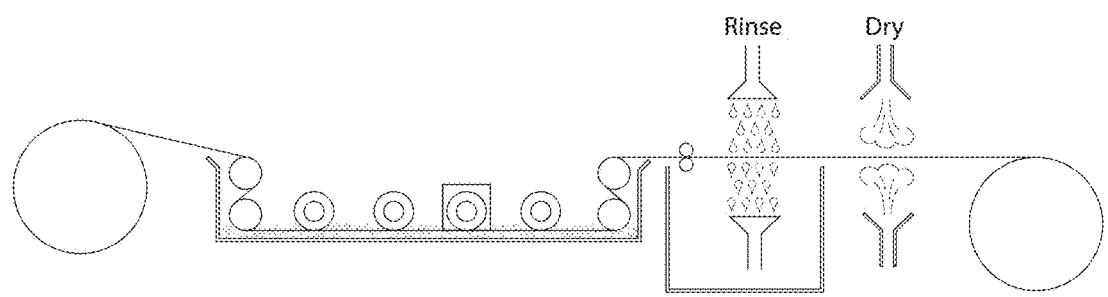

FIG. 12*b* illustrates one embodiment of a conveyorized system that includes processing substrates using rollers. Specifically, in FIG. 12*b*, roller-type applicators are partially immersed in solution (about 5-10% of the diameter or to the level of reaching inner counter electrode 10, in some embodiments). Depending on the compression applied to the rollers, there will be more or less of the substrate in intimate contact with the roller for faster throughput. More contact is needed to enable longer plating time for a specific thickness of deposit. The same compression can be used for faster throughput but thinner deposit thickness specified compared to when less pressure is used for thinner deposit.

Figure 13A:
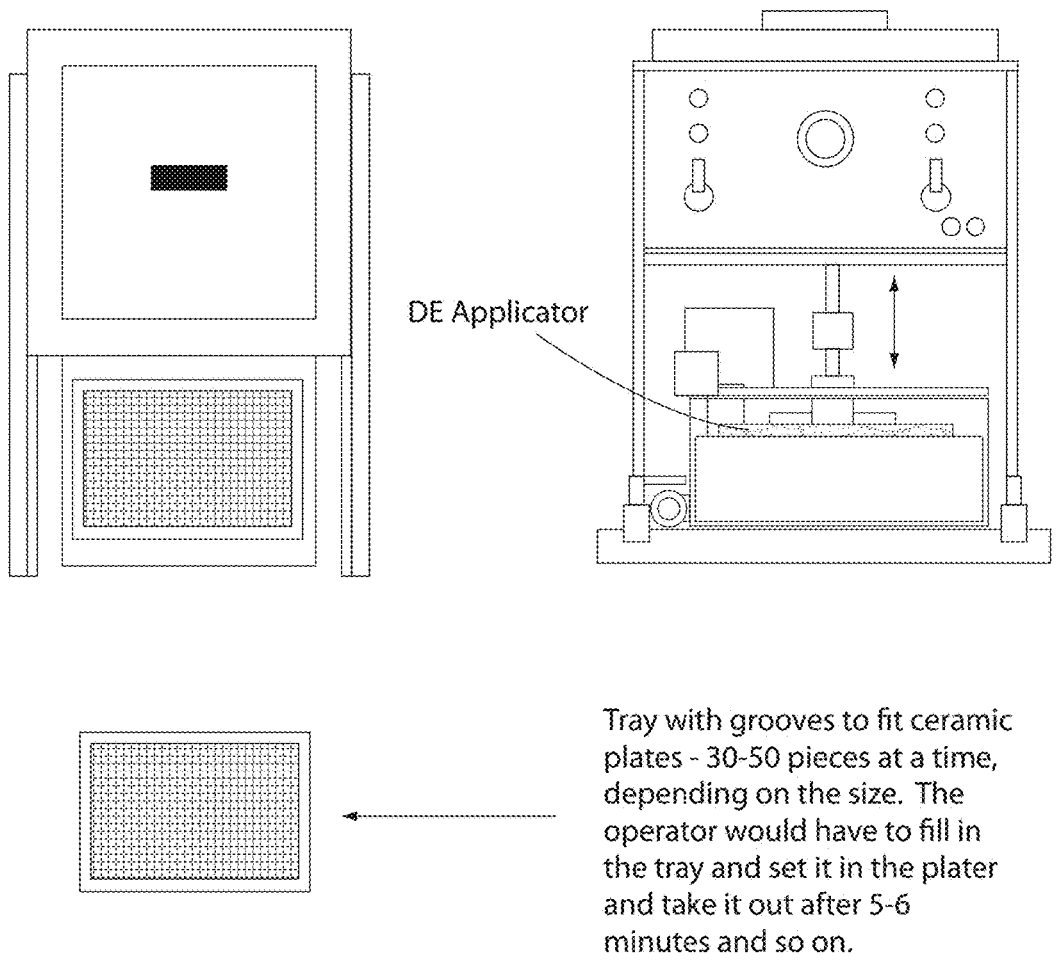
FIGS. 13a and 13b illustrate two embodiments of batch processing of substrates in accordance with some embodiments of the presently disclosed subject matter.
Figure 13B:
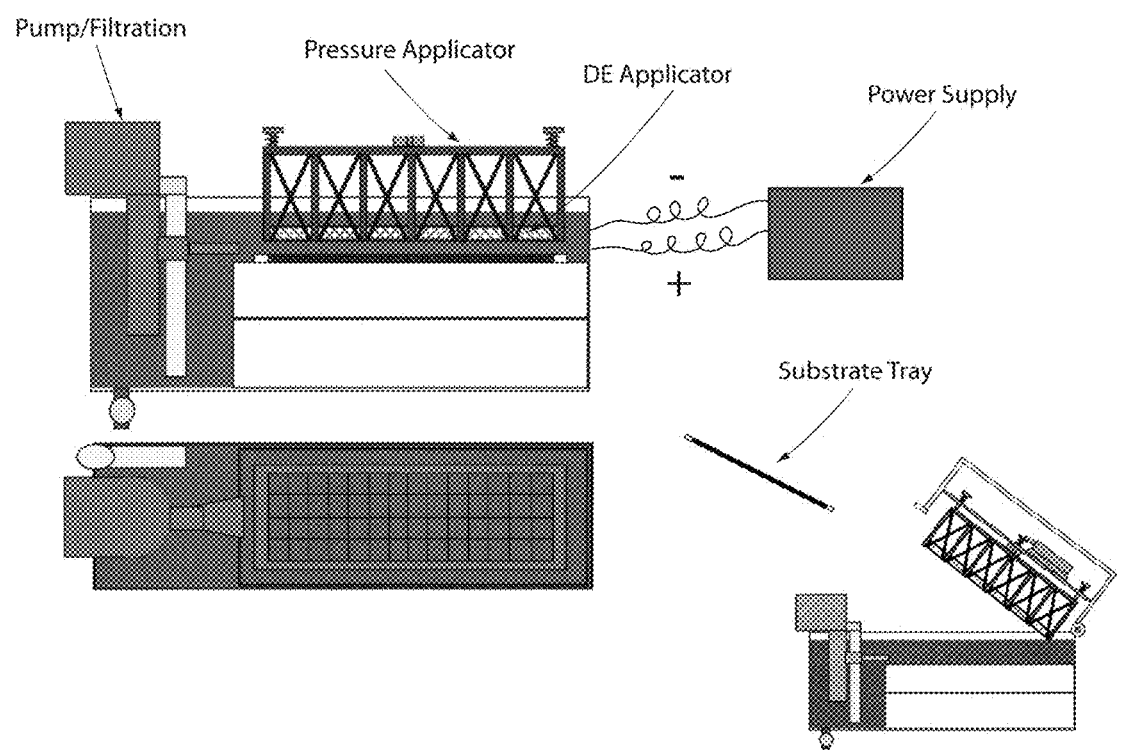

It should be appreciated that processing of substrates with one or both sides patterned can be performed using any appropriate arrangement of a conveyorized system, as would be known in the art. For example, FIGS. 13*a* and 13*b* illustrates one embodiment of batch processing of substrates with A-type (single sided) apparatuses.

An important aspect of potential implementation of the disclosed novel technology is the fabrication of printed flexible electronics (PFE). For some time and in particular recent years, there has been a major drive in electronics for production of good quality PFE. Typically, silver or copper pastes or carbon paste are screen printed or laser jet printed over plastic substrates such as PET to form flexible electronics. To achieve adequate conductivity, silver paste must be applied in significantly thicker layer (10× or more) than a pure metal to achieve adequate conductivity. Electroplated silver or copper pastes a few microns thick would be preferable improvement. In addition, current technology calls for carbon paste deposition to form resistors in flexible printed electronic devices. The same or similar technique of depositing carbon pastes can also be used to form seed layers for deposition of conductive metals, such as silver or copper with the disclosed contact electroplating technique.

In some embodiments, some substrates (such as semiconductor wafers used in integrated circuitry manufacturing) have tranches in size of a few nanometers to about 1 micron. The tranches must be filled with a metal (such as copper), which typically requires iterations of electroplating and polishing until the tranches are filled with metal and excess plating (including the initial seed layer) is removed from the surface). By using the disclosed method and apparatus, direct control over the electroplating process down to a nano-size level can be achieved. By using few nano-meters thick seed layer over large wafer area the method enables filing the tranches with a superior quality copper while minimizing the need for CMP processing.

EXAMPLES

The following Examples have been included to provide guidance to one of ordinary skill in the art for practicing representative embodiments of the presently disclosed subject matter. In light of the present disclosure and the general level of skill in the art, those of skill can appreciate that the following Examples are intended to be exemplary only and that numerous changes, modifications, and alterations can be employed without departing from the scope of the presently disclosed subject matter.

Example 1

Construction of Contact Electroplating Apparatus

Figure 14:
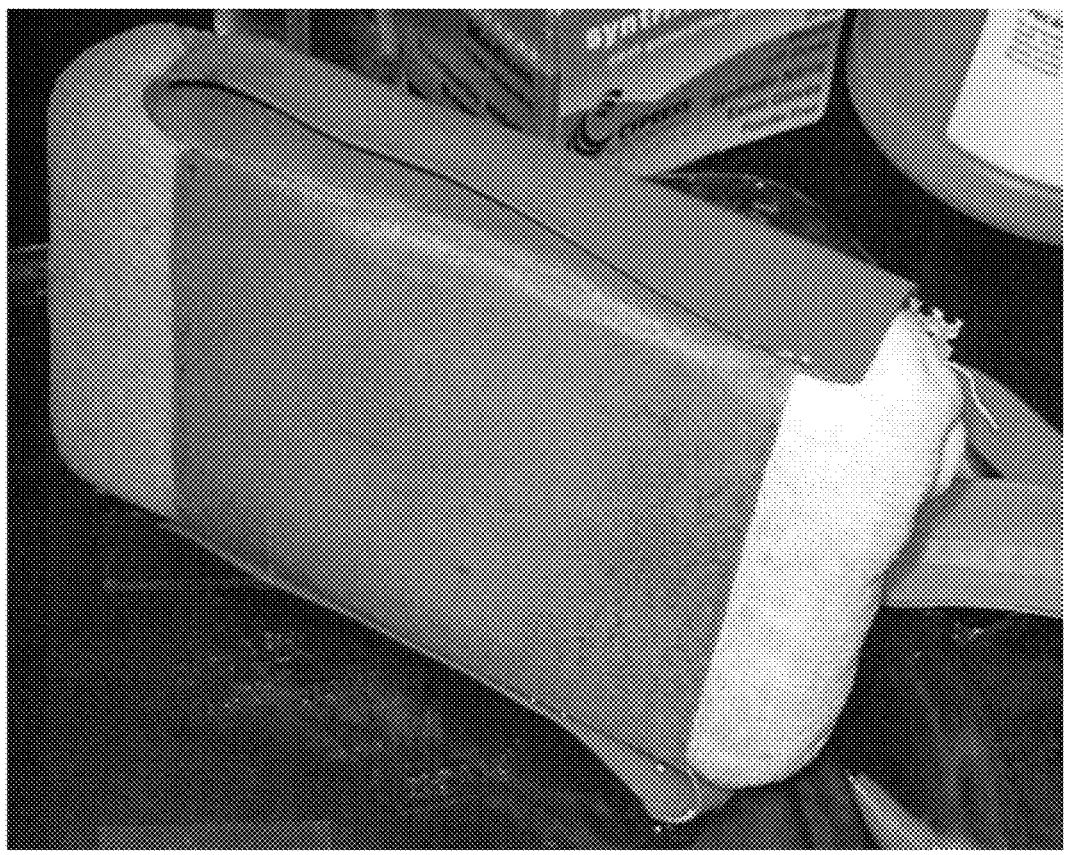
FIG. 14 is a perspective view of one embodiment of an apparatus produced in accordance with some embodiments of the presently disclosed subject matter.
Figures 15A, 15B, 15C, 15D, 15E, 15F, 15G, 15H, 15I:
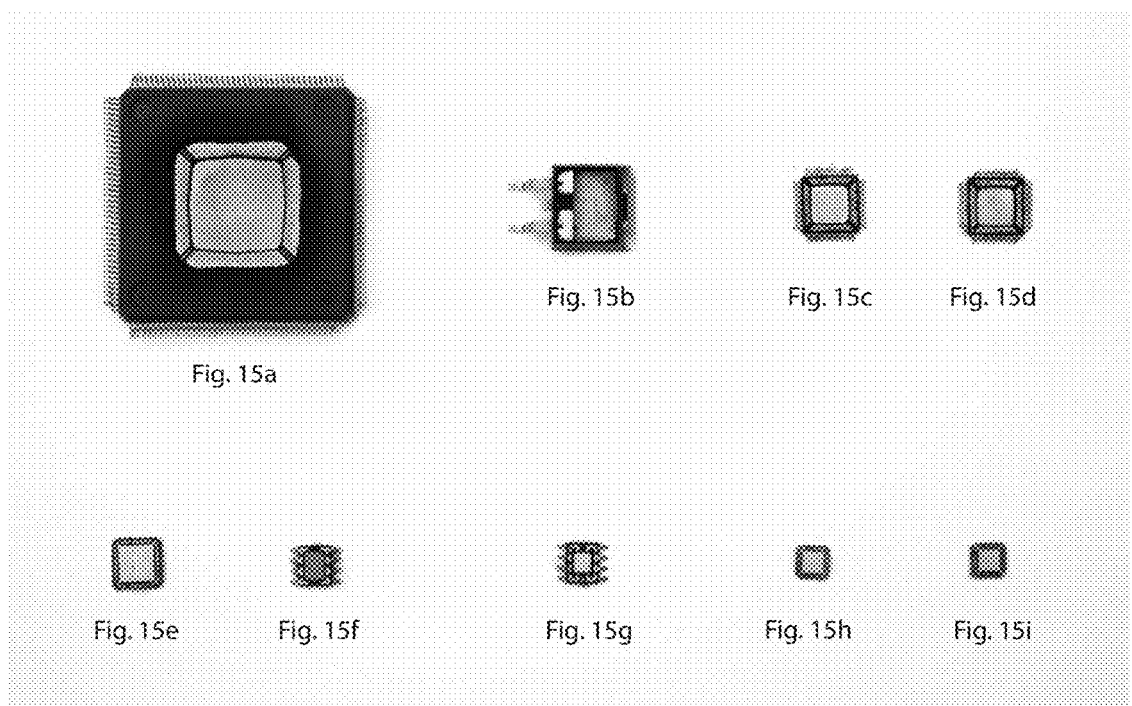
FIGS. 15a, 15b, 15c, 15d, 15e, 15f, 15g, 15h and 15i are photographic images of gold electroplated onto various discrete surface mount devices in accordance with some embodiments of the presently disclosed subject matter.

A direct electroplating apparatus in accordance with some embodiments of the presently disclosed subject matter was constructed, as shown in FIG. 14. A 4"×6", 1.3 mm thick portion of platinum/titanium mesh (100 microinches of platinum coating) obtained from Technic, Inc. was used as the anode on the counter electrode side of the apparatus. A 4"×6", 0.2 mm thick portion of stainless steel, gold-plated fine mesh material (obtained from McMaster, Inc.) was used as the working electrode portion of the apparatus. Porous polymer cloth (2-layer polyester pile cloth, 12 mm counter-imposed to allow for electrolyte penetration and electric field, pore size of 22 micron fibers) was positioned between the counter electrode and the working electrode. Current collectors were attached to electrodes, linking them to the respective polarity of a power supply. In addition, a silicon rubber enclosure (1.5 mm silicon sheet, obtained from McMaster, Inc.) was added over portions of the electrode to establish limits of the mesh materials exposed to the power supply current feed. The apparatus was used to electroplate standard printed wiring board test patterns, discrete surface mount electronic devices and patterned polymer substrate with silver.

Example 2

Contact Electroplating of Discrete Electronic Packages

The apparatus of Example 1 was used to electroplate gold onto various discrete surface mount devices in the range of ⅛" to 1" squares, as shown in the photographs of FIGS. 15a-15i. Particularly, silver plating solution (Cyless, provided by Technic, Inc.) was used as the electrolyte in a 5 cm deep, 20 cm×30 cm glass dish. The samples were adhered to the bottom of the dish using vinyl scotch tape. Electrolyte was added to the dish to a depth of about 2 cm and plating was initiated. With about 2 volts and 3.5 A total current, light pressure was applied for about 2-4 seconds and repeated 3 times for each test sample.

Example 3

Contact Electroplating of DBC Substrates

The apparatus of Example 1 was used to electroplate both nickel and silver on 6 DBC (Direct Bonded Copper substrates, used in power modules), as shown in the photographs of FIGS. 16a-16f. The substrates used were copper/ceramic substrates applied in power modules attached to heat spreaders. Using the disclosed oscillary device (10 minutes, oscillating gold 2 minutes, 1 amp), 4 microns nickel, 0.2 microns gold were electroplated onto the surface of the substrates. The data demonstrates the capability to directly electroplate DBC, to prepare it for attachment to heat spreaders by soldering.

Example 4

Contact Electroplating of Nickel on Copper Lines

Figure 17A:
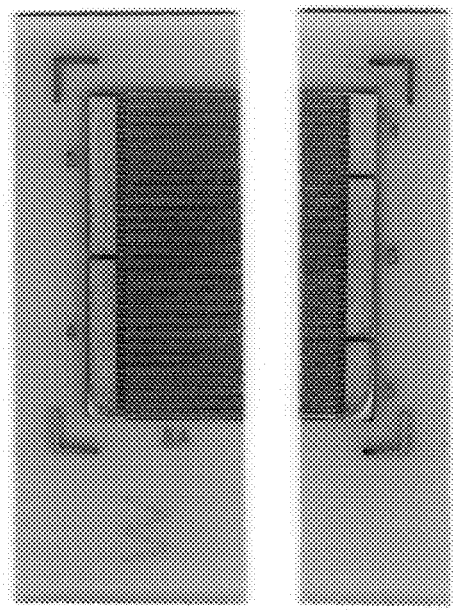
FIG. 17a is a PWB test pattern with cut out cross sections presented in FIGS. 17b and 17c as SEM images of a substrate pattern after direct electroplating of Nickel in accordance with some embodiments of the presently disclosed subject matter.
Figure 17B:
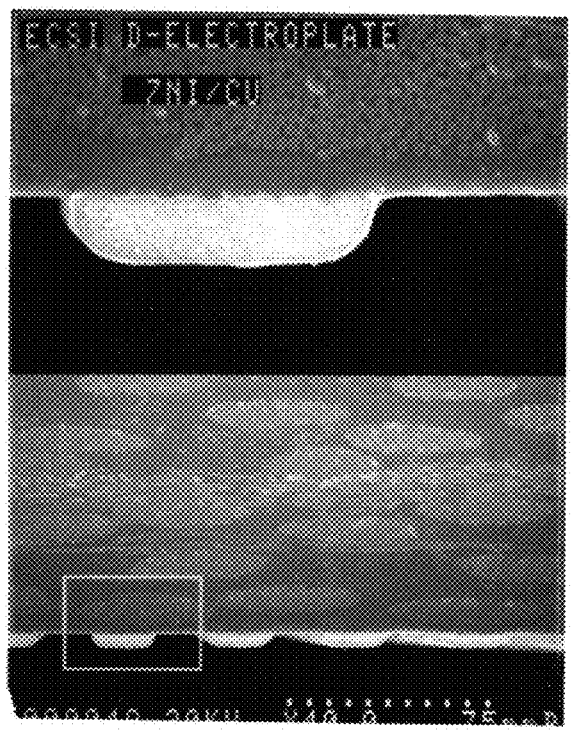
Figure 17C:
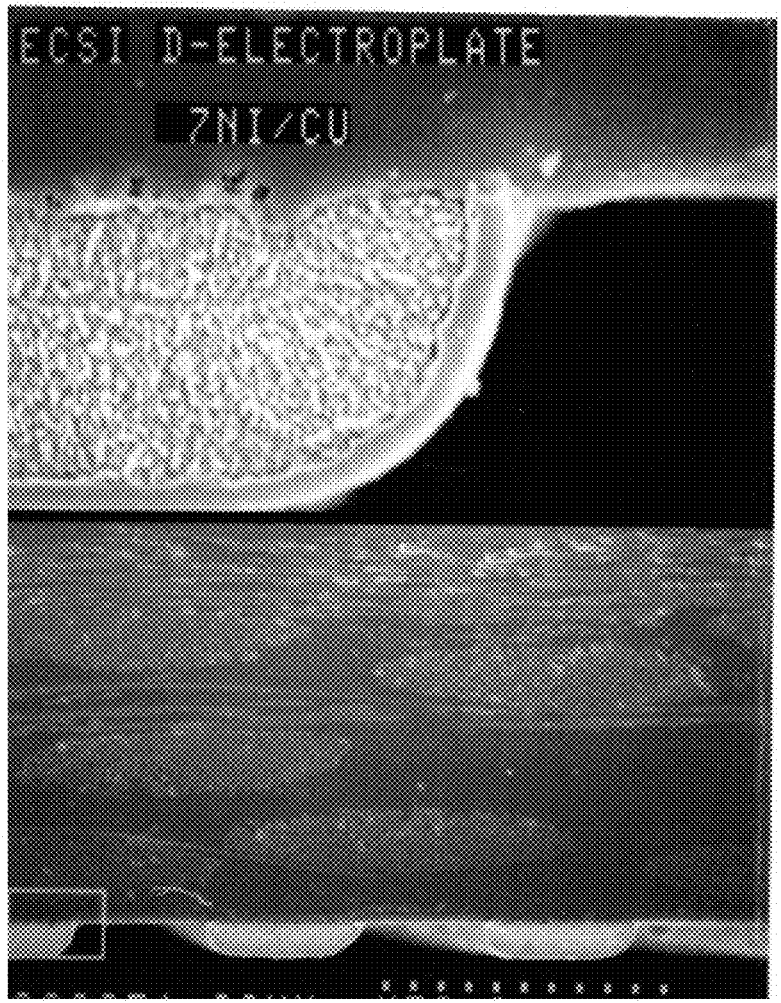

The apparatus of Example 1 was used to nickel plate standard PWB test patterns used to evaluate etching capability, as shown in FIGS. 17a-17c. 7 microns of nickel was deposited on the PWB test pattern. Completeness of the enclosure of copper with nickel was observed, illustrating the exceptional capability of the disclosed DE technology. The figures show isolated copper pattern with 7 microns nickel over 50 microns copper line, 200 microns wide. It was observed that the nickel was uniformly plated, and encapsulation was complete. FIGS. 17a-17c are SEM images (200× and 700×, respectively) of the PWB test pattern after direct electroplating using the disclosed apparatus. FIGS. 17a-17c are images from the same sample (Technic, Inc.) plating time in nickel sulfamate for 15 minutes. It can be concluded that uniformity of coverage is important for good soldering.

Example 5

Contact Electroplating of Standard Isolated Pattern Sample with Ni and Au

Figure 18A:
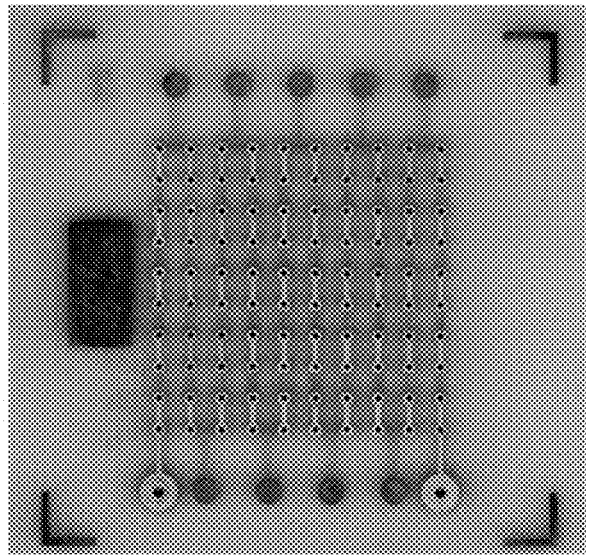
FIGS. 18a and 18b are photographs of Nickel and Gold plated substrates produced in accordance with some embodiments of the presently disclosed subject matter.
Figure 18B:
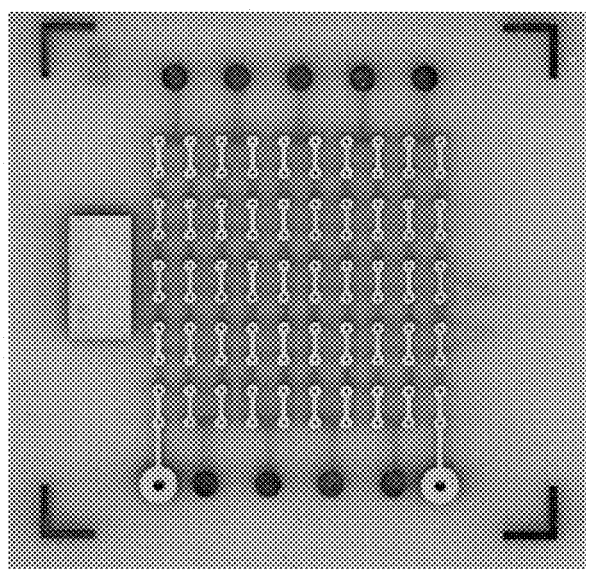

The apparatus of Example 1 was used to nickel and gold plate two test patterns, as shown in FIGS. 18a and 18b.

Example 6

Contact Electroplating Etched and Isolated PWB Test Patterns with Ni

Figure 19:
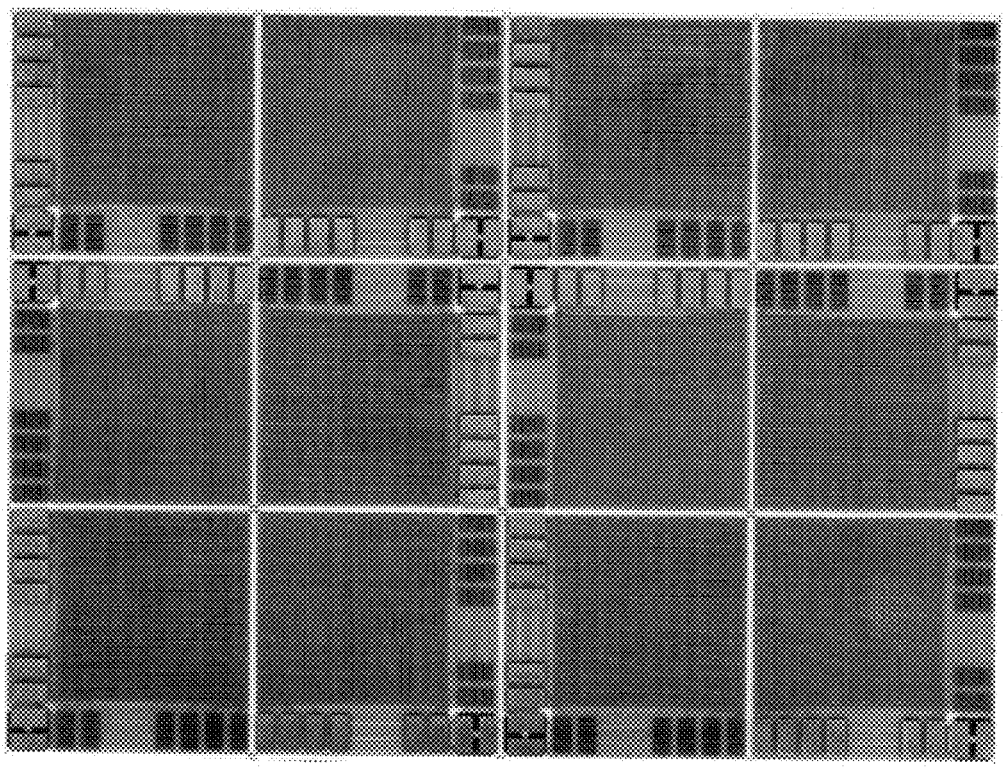
FIGS. 19-23 illustrate substrates silver plated in accordance with some embodiments of the presently disclosed subject matter.

The apparatus of Example 1 was used to nickel plate etched, isolated PWB test patterns, with minimum line and space of 50 microns, as shown in FIG. 19.

Example 7

Contact Electroplating High Resistance Carbon Patterned Images with Silver

Figure 20:
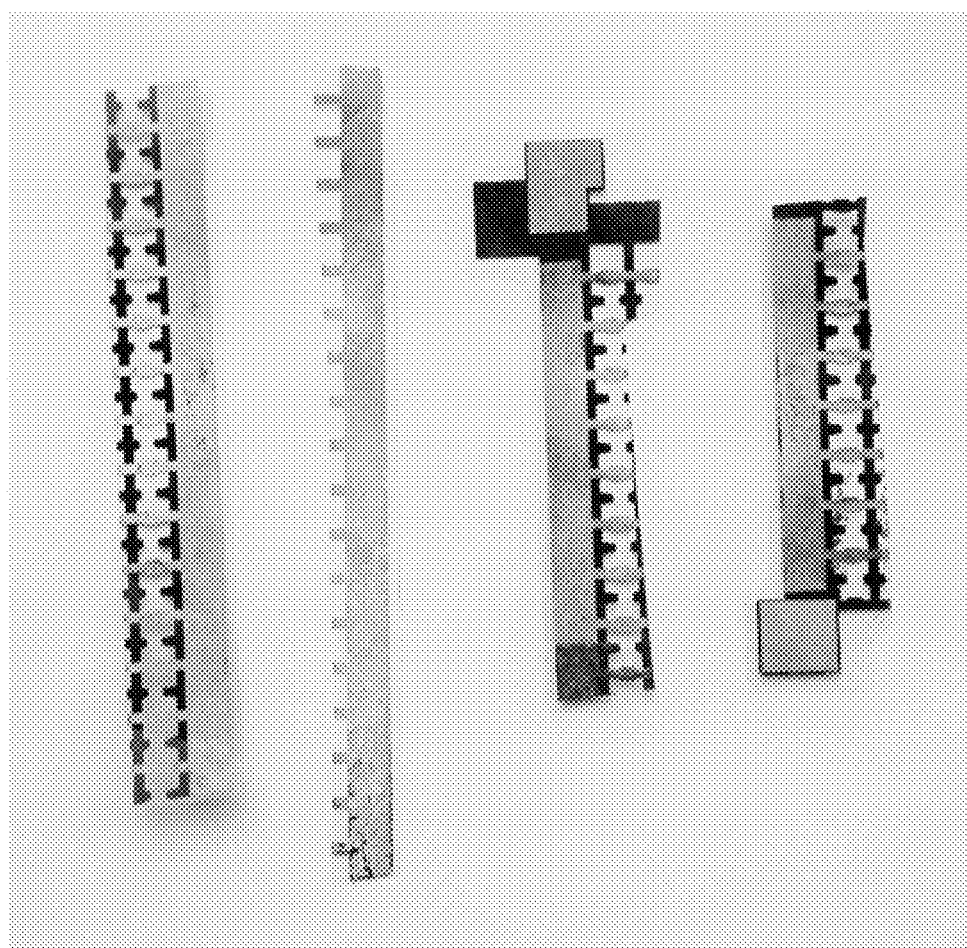

Carbon pattern samples designed for resistor fabrication were obtained from E. I. DuPont de Nemours and Company (Wilmington, Del.). Cyless II (available from Technic, Inc. of Cranston, R.I.) was used as the silver plating solution. The DE apparatus of Example 1 with the patterned polymer substrate was immersed in a 5 cm high tank containing 2.5 cm electrolyte solution. The apparatus was mildly compressed against the substrate and the negative polarity was imposed to the working electrode. The compressed state was held for 4 seconds and released. Silver plating over the carbon seed layer was observed, as shown in FIG. 20. The motion was repeated two additional times. The initial seed layer resistance of about 350 ohms was reduced to about 0.2 ohms across the 5 mm long and 1.5 mm wide pattern.

Example 8

Contact Electroplating Carbon Patterned Low Conductivity PWB Test Patterns

Figure 21:
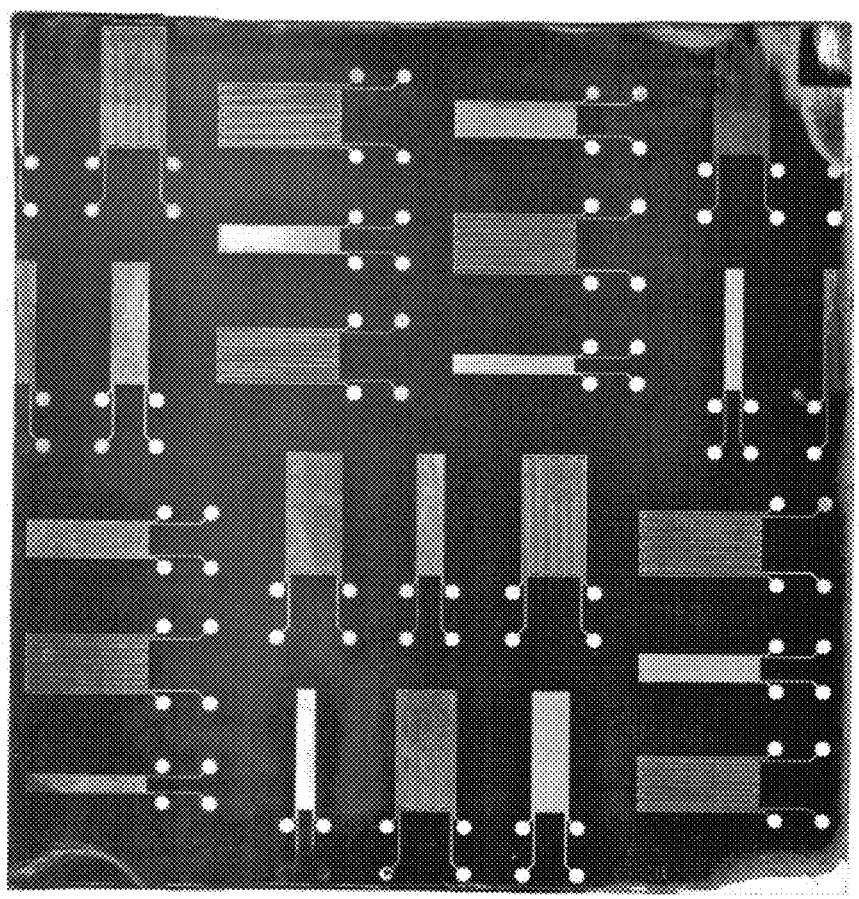

The method of Example 8 was repeated over carbon-printed test samples. Results are shown in FIG. 21.

Example 9

Contact Electroplating PWB Etching Test Patterns

Figure 22:
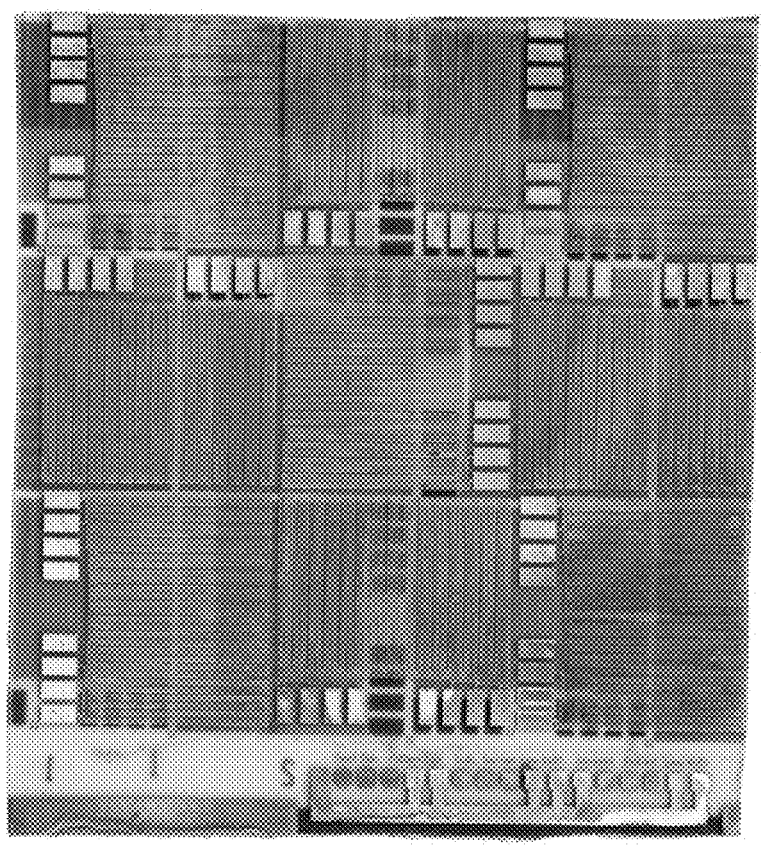

The method of Example 8 was repeated using silver over the same pattern. Results are shown in FIG. 22.

Example 10

Contact Electroplating Laser Formed Electronic Device Patterns

Figure 23:
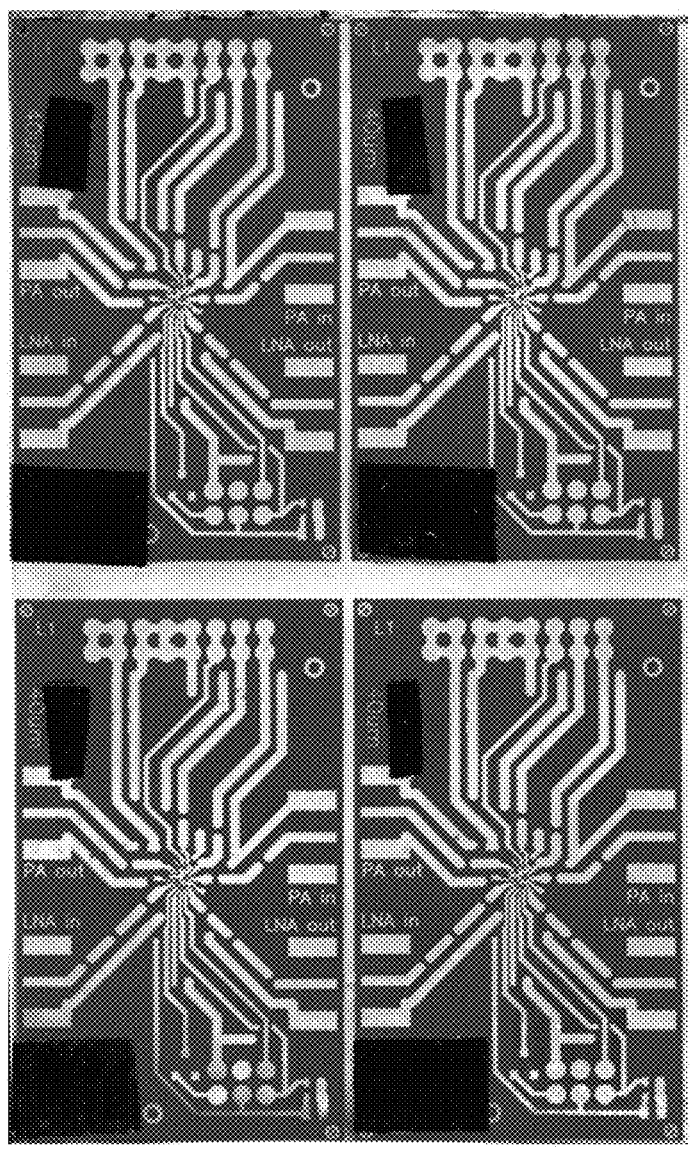

The apparatus of claim 1 was used to plate copper and silver onto laser-formed electronic device with nominal resistance of 100 ohms/5 cm length and 2 mm width and minimal spacing of 40 microns, as shown in FIG. 23. Resistance was reduced to less than 0.01 ohms/5 cm length and 2 mm width in 10 seconds. To test for the viability of the depleting portion of the process, the plating and deplating was carried over for additional 10 times without any visible effect on the materials used.

What is claimed is:

1. A method of electroplating metal onto a substrate, the method comprising:
   immersing an apparatus for electroplating a metal onto a substrate in an electroplating solution comprising the metal to be electroplated, wherein the apparatus comprises:
   a substrate comprising a seed pattern with a resistance of 0.001 Ω·cm-100,000 Ω·cm;
   a working electrode comprising fine flexible metal mesh, metal fiber cloth, metal fiber with polymer thread, or metal web, wherein the working electrode has a thickness of 1.5 mm or less;
   a counter electrode comprising fine metal mesh, metal fiber cloth, metal web, or metal mesh; and
   a chemically inert porous and flexible material that directly contacts both the working electrode and the counter electrode;
   positioning current collectors to link both electrodes to a respective polarity of a power supply;
   activating the power supply;
   electroplating 1-2 microns of the metal onto the fine metal mesh, metal fiber cloth, or metal web of the working electrode;
   deactivating the power supply;
   positioning the apparatus to establish uniform intimate contact with the substrate such that the fine flexible metal mesh, metal fiber cloth, metal web, or metal fiber with polymer thread of the working electrode directly contacts the chemically inert porous and flexible material and directly contacts the seed pattern of the substrate, wherein the chemically inert porous and flexible material is configured to compress the metal mesh, metal fiber cloth, metal web, or metal fiber with polymer thread of the working electrode;
   proceeding with DC or reverse pulse electroplating for about 2 to 120 seconds to achieve conductivity specified for a single or multiple conveyorized step processing of the seed pattern;
   moving the apparatus to remove the uniform intimate contact with the substrate after the DC or reverse pulse electroplating or proceeding with a next step of conveyorized processing; and
   optionally introducing a new substrate.

2. The method of claim 1, further comprising initiating a vibratory motion in the apparatus to enable exchange of matter at an apparatus/substrate interface prior to the proceeding with DC or reverse pulse electroplating.

3. The method of claim 1, wherein the apparatus is arranged horizontally or vertically.

4. The method of claim 1, wherein the working electrode and counter electrode are constructed from gold, silver, copper, nickel, palladium, platinum, titanium, stainless steel, cobalt, thallium, tantalum, rhodium, iridium, ruthenium, osmium or alloys of gold, alloys of silver, alloys of copper, tungsten, vanadium, alloys of nickel, alloys of palladium, alloys of platinum, platinized titanium, platinum clad niobium or tantalum, gold plated stainless steel, copper, nickel, or combinations thereof.

5. The method of claim 1, wherein the chemically inert porous and flexible material is selected from the group comprising porous polymer sponge, pile cloth material, or combinations thereof.

6. The method of claim 1, wherein the chemically porous and flexible material has a porosity of at least 40%.

7. The method of claim 1, wherein the apparatus is formed in a pad configuration or a roller configuration.

8. The method of claim 1, wherein the apparatus comprises a detachable perforated compressing pad constructed from a chemically stable rigid polymer material to exert uniform compression.

9. The method of claim 1, wherein the fine flexible metal mesh of the working electrode, the fine metal mesh of the counter electrode, or both are platinized titanium, nickel, gold-plated copper, or stainless steel.

10. The method of claim 1, further comprising a recirculation element to provide and recirculate electrolyte through the apparatus.

11. The method of claim 1, further comprising an internal element to provide electrolyte or metal ions to a dry substrate upon contact.

12. The method of claim 1, wherein the power supply is connected to the respective polarity of each electrode, and wherein the power supply has a forward and reverse pulse capability of about 0.01 to 5000 Hertz.

13. The method of claim 1, wherein the apparatus further comprises a compression element to enable uniform compression and vibratory motion of the apparatus in the frequency range of 1-100 Hertz and amplitude in the range of 0.64-6.4 mm.

14. The method of claim 1, wherein the apparatus further comprises a flip-over device synchronized with a power supply.

15. The method of claim 1, wherein the working electrode is configured to be parallel to the substrate when in use.

16. The method of claim 1, wherein the apparatus is configured to electroplate the patterned seed layer with a thickness of 0.1-10 microns of desired metal.

17. The method of claim 1, wherein the seed pattern comprises metal, carbon, toner, or combinations thereof.

18. The method claim 1, wherein the working electrode is porous and has a porosity of about 30-99%.

19. The method of claim 1, wherein the working electrode, counter electrode, or both are constructed from wires with a diameter of about 10 micron to about 1.0 millimeter.

20. The method of claim 1, wherein the working electrode, counter electrode, or both are constructed from wires with a diameter of about 10 nanometers to about 1.0 millimeter.

* * * * *